United States Patent
Yip et al.

(10) Patent No.: US 6,480,076 B2
(45) Date of Patent: Nov. 12, 2002

(54) RECESSED REFLECTOR SINGLE PHASE UNIDIRECTIONAL TRANSDUCER

(75) Inventors: David S. Yip, La Mirada; Alvin M. Kong, Manhattan Beach; Rahil U. Bhorania, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/745,820

(22) Filed: Dec. 21, 2000

(65) Prior Publication Data

US 2002/0079987 A1 Jun. 27, 2002

(51) Int. Cl.[7] .................................................. H03H 9/64
(52) U.S. Cl. ..................... 333/193; 333/195; 310/313 B
(58) Field of Search .................................. 333/193, 194, 333/195, 196; 310/313 R, 313 B, 313 D

(56) References Cited

U.S. PATENT DOCUMENTS

| | | | |
|---|---|---|---|
| 4,353,046 A | | 10/1982 | Hartmann .................... 333/194 |
| 4,454,488 A | * | 6/1984 | Hartmann ................ 310/313 D |
| 5,073,763 A | | 12/1991 | Wright ........................ 333/193 |
| 5,196,753 A | * | 3/1993 | Greer ....................... 310/313 B |
| 5,793,146 A | | 8/1998 | Wright .................... 310/313 B |

OTHER PUBLICATIONS

T. Kodama, et al., "Design of Low Loss SAW Filters Employing Distributed Acoustic Reflection Transducers", IEEE 1986 Ultrasonic Symposium—59.
P. V. Wright, et al., "Single–Phase Unidirectional Transducers Employing Uniform–Width Dithered Electrodes", 1995 IEEE Ultrasonics Symposium—27.

* cited by examiner

Primary Examiner—Robert Pascal
Assistant Examiner—Dean Takaoka

(57) ABSTRACT

The invention relates to a new family of surface acoustic wave single-phase unidirectional transducers (SPUDTs) by using M uniform width, uniformly spaced, single-level interdigitated electrodes lying on a uniform grid of a piezoelectric substrate where unidirectionality is achieved by selectively etching reflective structures into the substrate either in the spaces located between adjacent electrodes or under selected electrodes of the transducer. A SAW filter, resonator or delay line can also be formed by fabricating two such transducers on a single substrate, each having surface acoustic waves radiating towards the other.

7 Claims, 16 Drawing Sheets

UV Light

RECESSED REFLECTOR SINGLE PHASE UNIDIRECTIONAL TRANSDUCER

BACKGROUND OF THE INVENTION

1. Field of the Invention

The present invention relates generally to surface acoustic wave (SAW) transducers and, more specifically to a new family of surface acoustic wave single-phase unidirectional transducers (SPUDTs) by using uniform width, single-level electrodes lying on a uniform grid of a piezoelectric substrate where unidirectionality is achieved by selectively etching reflective structures into the substrate either in the spaces located between adjacent electrodes or under selected electrodes of the transducer. A SAW filter, resonator or delay line can also be formed by fabricating two such transducers on a single substrate, each having surface acoustic waves radiating towards the other.

2. Description of the Prior Art

Surface acoustic wave (SAW) devices are fabricated by delineating thin-film conductor patterns on piezoelectric single-crystal substrates. These devices make use of surface acoustic waves, Rayleigh waves, or like waves that propagate at the velocity of sound along a surface of the crystal. In a conventional SAW device, each wave is excited by an input electrical signal applied to a set of interdigitated electrode transducers that have been disposed on the surface of the crystal. The wave propagates along the surface of the crystal where it is detected by a separate set of interdigitated electrodes that are also disposed on the surface of the crystal. The shape and spacing of the electrodes determines the center frequency and the band shape of the detected wave. Generally, the smaller the width of the electrode or the lower the sampling rate (i.e. number of electrodes per period), the higher the operating frequency of the device. The amplitude of the propagated wave at a particular frequency is determined by the constructive interference between the waves generated at individual electrodes in the set of input interdigitated electrodes.

Single-phase unidirectional transducer (SPUDT) SAW filters are a distinct type of SAW device. Such filters are widely used in communication systems because of their small group delay ripple (GDR), low insertion loss, and simplicity of use in matching circuits. The basic principle of a SPUDT is to have SAW reflectors displaced inside the SAW transducer in such a way that the reflection and transduction centers of acoustic waves are shifted spatially in phase by plus or minus 45 degrees or plus or minus 135 degrees. Upon satisfaction of this principle, a transduction wave and a reflected wave constructively enhance each other in one direction and destructively cancel each other in other directions, thereby causing the waves to propagate unidirectionally through the transducer. A properly designed SPUDT filter can achieve low insertion loss and high triple transit suppression at the same time by using relatively simple RLC (resistor inductor capacitor) matching circuits at the input and output transducers. The triple transit is caused by regenerated SAW between transducers that cause large amplitude ripples and GDR in the passband.

Various types of SPUDTs have been developed since the 1980's and most of them rely exclusively on the metal electrode fingers to act as acoustic wave reflectors. For example, distributed acoustic reflection transducer (DART) SPUDT techniques are widely used in the SAW industry for low loss, high performance SAW filter applications. And recently, group SPUDT (GSPUDT) and dithered SPUDT (DSPUDT) techniques have been developed for high frequency filter applications. And while there are advantages to each of these techniques, each has certain limitations.

For example, a typical DART SPUDT, like that described in the publication "Design of Low-loss SAW Filters Employing Distributed Acoustic Reflection Transducers," by *Kodoma* et al., IEEE Ultrasonics Symposium, 1986, has advantages that include single level metallization, strong electrical coupling and strong finger (electrode) reflectivity. But the small critical geometry of 0.6 $\mu$m (finger width=$\lambda/8$) that easily facilitates transducer fabrication using standard photolithography techniques, limits the SAW filter device to a 600 MHz operating frequency on ST-Quartz. The higher the sampling rate of the transducer for a given critical dimension (CD), the lower the operating frequency (fo), as provided by the equation fo vo/(CD*S), where S is the number of electrode fingers per wavelength $\lambda$(sampling rate of the transducer), vo is the SAW propagating velocity on the substrate, and the critical dimension (CD) is the smaller of either the electrode width or the gap width between adjacent electrodes.

A GSPUDT, like that disclosed in U.S. Pat. No. 5,073,763, can extend the operating frequency range of conventional DART SPUDT SAW filter devices to 1GHz on ST-Quartz due to a smaller sampling rate, e.g., 8 electrode fingers per 3$\lambda$. However, although the sampling rate of the GSPUDT is small relative to the DART SPUDT it is still relatively high and thus limits the highest achievable operating frequency of the GSPUDT. Moreover, a multiple level metal deposition process is required at certain electrodes to create a predetermined, distributed internal reflection in both magnitude and phase necessary to provide unidirectionality.

U.S. Pat. No. 5,793,146 and the publication "Single-Phase Unidirectional Transducers Employing Uniform-Width Dithered Electrodes", by *Wright* et al., IEEE Ultrasonics Symposium, 1995, disclose a DSPUDT SAW filter device. The DSPUDT, like the DART SPUDT, has the advantage of single level metallization. However, DSPUDT techniques related to high frequency SAW filter applications include at least two disadvantages. First, the transducer reflection is a function of the metal thickness and the amount of electrode dithering. To generate a sufficiently strong transducer reflection for high performance low loss SPUDT SAW filters, either the electrode metal must be prohibitively thick, or certain electrode gaps must become very narrow to accommodate extensive dithering. The result of the prohibitively thick electrode finger metal is high insertion loss due to bulk wave conversion and distorted filter response due to mass loading. And by narrowing the electrode gaps, the critical geometry is forced below current fabrication thresholds which, as a result, limits the achievable highest operating frequency. Second, the reflection function implementation accuracy of a SAW device is determined by how accurately the dithered fingers (electrodes) are photolithographically printed on a substrate mask. And, because of the finite address size of the e-beam machine used to form the electrodes, the electrodes can only be dithered in a discrete fashion. Therefore, any misplacement of the electrodes due to grid snapping will interrupt the dithering pattern of the whole period resulting in large reflection function implementation error, especially at high operating frequencies where the critical geometries are small. Moreover, any misplacement of the least dithered electrodes in a period further magnifies implementation error.

As previously mentioned, various types of SPUDTs have been developed since the 1980's and most of them rely on metal electrodes acting as acoustic wave reflectors. U.S. Pat.

No. 4,353,046, on the other hand, integrates conventional acoustic wave reflector technology with grooved reflector structures so that distributed internal reflections, once considered detrimental to a SAW device, are deliberately integrated within the interdigital transducer to produce desirable effects. However, the SAW devices like those disclosed by U.S. Pat. No. 4,353,046 are limited to a split-electrode geometry with a four electrode per wavelength device topology that is functionally excluded at higher operating frequencies because of their relatively small gap and electrode widths. Specifically, the SAW device structures like those described in the '046 Patent have sampling rates of $\lambda/4$ or 4 electrodes per the length of one period $(\lambda)$ and, as previously described, this relatively high sampling rate limits the device's operating frequency.

As communication and like system technologies advance, there is a need for making higher operating frequency and improved performance SPUDT filters beyond the standards currently attainable. Therefore, based on techniques known in the art for surface acoustic wave (SAW) single-phase unidirectional transducers (SPUDTs), a new family of single-phase unidirectional transducers (SPUDTs) having the capability to facilitate SPUDT filter operation at higher frequencies with improved performance is desirable.

SUMMARY OF THE INVENTION

The present invention provides a surface acoustic wave transducer having a transduction length measured in wavelengths $(\lambda)$. The surface acoustic wave transducer is fabricated on a piezoelectric substrate. The transducer includes a pattern of M uniform-width, uniformly spaced, single-level interdigitated electrodes per each $N\lambda$ of the transduction length, with adjacent electrodes having a center-to-center spacing of $N\lambda/M$. Within one $N\lambda$ of the transduction length, the surface acoustic wave transducer includes at least one first reflective structure selectively formed either in a gap located between two adjacent electrodes or under selected electrodes fingers for creating a first finite localized surface acoustic wave reflection function other than zero in both magnitude and phase. Within one other $N\lambda$ of the transduction length, the surface acoustic wave transducer includes at least one second reflective structure selectively formed either in a gap located between two adjacent electrodes or under selected electrodes for creating a second finite localized surface acoustic wave reflection other than zero in both magnitude and phase. The positions and the relative reflective strengths of the reflective structures achieve a finite reflection function of the transducer equal to zero or other than zero in both magnitude and phase.

In another aspect of the present invention, using the principles of the present invention, a unidirectional transducer with a predetermined non-zero reflection is provided. And, by fabricating two such unidirectional transducers on a single piezoelectric substrate a novel filter is provided wherein the reflective structures of each unidirectional transducer are designed such that the surface acoustic wave (SAW) of each transducer propagates substantially towards the other.

BRIEF DESCRIPTION OF THE DRAWINGS

Reference is now made to the following description and attached drawings, wherein:

FIG. 1b is a of a top view illustration of the RDSPUDT shown in FIG. 1a;

FIG. 2b is a top view illustration of the RGSPUDT shown in FIG. 2a;

FIG. 3b is a top view illustration of the RFSPUDT shown in FIG. 3a;

DETAILED DESCRIPTION OF THE INVENTION

Figure 1A:
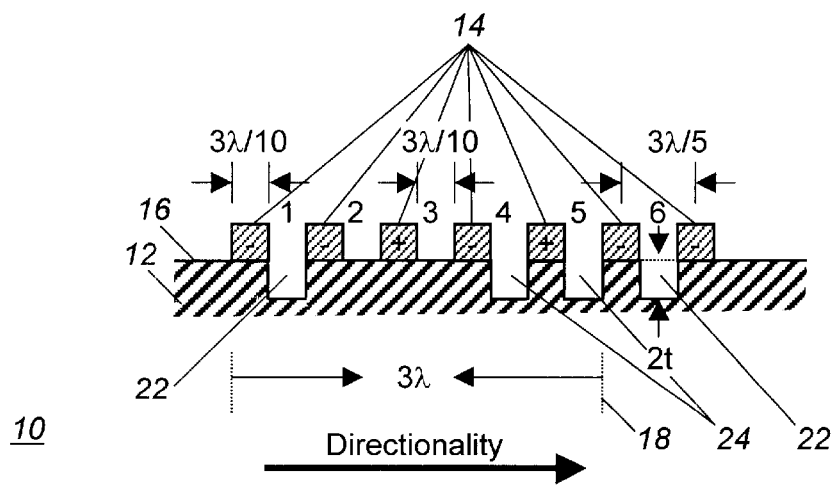
FIG. 1a is a side cross-sectional view illustration of a recessed dot single-phase unidirectional transducer (RDSPUDT) in accordance with an embodiment of the present invention.

The present invention discloses a new family of single-phase unidirectional transducers (SPUDTs). This new family of SPUDTs, referenced herein as recessed reflector SPUDTs (RRSPUDTs) include, recessed dot single-phase unidirectional transducers (RDSPUDTs), recessed gap single-phase unidirectional transducers (RGSPUDTs) and recessed finger single-phase unidirectional transducers (RFSPUDTs). Generally, these transducers are comprised of uniform width, single-level electrode fingers (electrodes) lying in a uniform grid on a surface of a piezoelectric substrate with recessed reflectors selectively etched into the substrate surface either between certain adjacent electrodes or under selected electrode fingers. The transducer sampling rates are of the general form $N\lambda/M$, where M is equal to the number of electrodes per every $N\lambda$ of the transducer's transduction length, and where M and N are integers and M>N. The transduction length is measured in wavelengths $(\lambda)$ and is defined as a length of the transducer in which one group of electrode fingers are connected to a common bus bar, and the other group of electrode fingers with the opposite polarity are connected to a separate common bus bar. Surface acoustic wave (SAW) generation takes place within the transduction length as a result of the transduction of the electrical excitation between the two groups of electrode fingers. Adjacent electrodes have a center-to-center spacing of $N\lambda/M$ and both the electrodes and the recessed reflectors provide sources of SAW reflection.

And by selectively locating the recessed reflectors and adjusting the reflectivity of each reflector, the net transducer reflection due to the recessed reflective structures is non-zero with predetermined magnitude and phase to achieve unidirectionality. Thus, unidirectionality is substantially achieved in the present invention by selectively etching recesses within selected gaps of a particular transducer or under selected electrode fingers of the transducer. However, it is important to note that the present invention does not require every $N\lambda$ of the transducer's transduction length to contain a recessed structure. Thus, the net transducer reflection due to the electrode reflection within a $N\lambda$ of the transduction length not containing such a structure is zero. And the zero reflection effect is a characteristic of the particular transducer's sampling rate.

For purposes of illustrating the fundamental principles of the present invention, the embodiments of the present invention are described herein using a transducer having a $3\lambda/5$ sampling rate –5 electrode fingers per each $3\lambda$ of the transduction length—and a periodic electrode finger sequence of '−−+−+', where '−' is a negative polarity and '+' is a positive polarity. In other words, the electrode sequence has a period of 5 electrode fingers within a transduction length of $3\lambda$. However, it is important to note that these are not necessary limitations of the present invention thus it should be understood that the principles of the present invention are not limited to any particular transduction length, any particular sampling rate, or any particular periodic electrode finger sequence. For example, the recessed reflector SPUDTs (RRSPUDTs) disclosed by the present invention can exist for sampling rates that include, but are not limited to $\lambda/4$, $\lambda/3$, $2\lambda/5$, $3\lambda/5$, $3\lambda/7$, $3\lambda/8$, $4\lambda/7$ and $5\lambda/8$. It is also important to note that the RRSPUDTs disclosed by the present invention can be fabricated on any piezoelectric substrate including, but not limited to lithium niobate (LiNbO$_3$), lithium tantalate (LiTaO$_3$) and Quartz. Additionally, the electrode fingers can be formed from any metal commonly used in the SAW industry, including but not limited to aluminum alloy, chromium, gold, copper, and titanium.

Figure 1B:
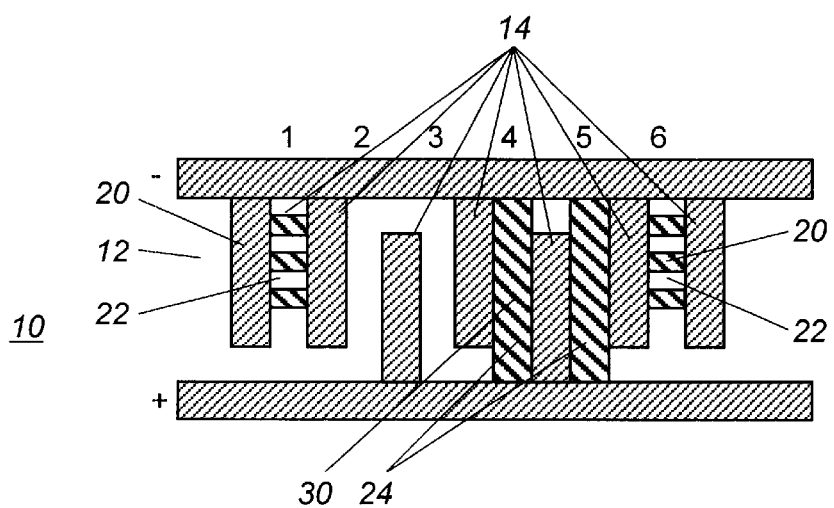

Referring to FIG. 1, in accordance with an embodiment of the present invention, a surface acoustic wave RDSPUDT transducer 10 is illustrated in FIG. 1*a* in side cross-sectional view and in FIG. 1*b* in top-view. In the present example, the transducer 10 includes in each $3\lambda$ of the transduction length 18 of a piezoelectric substrate 12, a pattern of five uniform-width, uniformly spaced, single-level interdigitated electrodes 14 in a '−−+−+' electrode finger sequence formed on a surface 16 of the substrate 12. The transducer 10 further includes a plurality of gaps numbered one through six located between adjacent electrodes 14, and a plurality of reflective recessed gap structures (22, 24) selectively etched in the gaps located at positions numbered 1 and 6 and 4 and 5, respectively. Again, it is important to note that any desired sampling rate, electrode sequence or electrode width can be used with the present invention, so long as a pattern of single level, uniform-width, uniformly spaced electrodes 14 are formed on the substrate 12. Alternatively, the recessed gaps structures (22,24) can be replaced by electrically insulated dots (not shown) deposited on the substrate surface 16, by impurities (not shown) ion-implanted into the surface 16, or by any other structural disturbance that can create a surface acoustic wave (SAW) reflection. In some limited cases, depending on the sampling rate and the electrode finger sequence, conductive materials can also be used to replace the recessed gap structures (22, 24).

Referring to FIGS. 1*a* and 1*b*, the pattern of interdigitated electrodes 14 are located in a $3\lambda/5$ uniform grid. Each electrode 14 has a width of approximately $3\lambda/10$ and adjacent electrodes 14 have a center to center spacing of approximately $3\lambda/5$. Each of the gaps numbered 1 through 6 has a width of approximately $3\lambda/10$. To form the reflective structures (22, 24) that affect the reflection function of the transducer 10, selected gaps numbered 1,4,5, and 6 are all recessed to a uniform depth. The depth, herein also referenced as the recessed dot depth is approximately (2*t*), where (t) equals a predetermined value. The first reflective structure 22, here shown at gap positions numbered 1 and 6, is formed by selectively etching multiple randomly distributed recesses 20 within a selected gap of the transducer 10 such that only approximately 50% of the gap is recessed (i.e., recessed gap density=0.5). The second reflective structure 24, here formed at gap positions numbered 4 and 5, is formed by selectively etching a continuous recess 30 within a selected gap of the transducer 10 such that approximately 100% of the gap is recessed (i.e., recessed gap density=1.0). The purpose of recessing only approximately 50% of gaps 1 and 6 and 100% of gaps 4 and 5, is to insure that gaps 1 and 6 have approximately one-half the density and therefore one-half the reflection of gaps 4 and 5. In other words, within every $3\lambda$ of the transduction length 18 a recessed dot pattern represents the location and recessed dot density of each recessed gap structure (22,24) within the transducer 10. And in the present example, the recessed dot pattern is defined as (0.5, 0, 0, 1, 1). Each number in the recessed dot pattern represents the relative recessed gap density (from left to right) in one period 3 of the transducer 10, with a zero meaning the corresponding gap is not recessed. It is important to note, however, that the density of each recessed gap structure (22, 24), herein referenced as a recessed dot density, can vary between 0.0 and 1.0. The recessed dot pattern, like the electrode finger sequence, is periodic throughout the entire transducer 10. The reflective structures (22,24) are etched within the transducer 10 according to the recessed dot pattern so that the reflection and the transduction centers of the transducer 10 are shifted spatially by plus or minus 45 degrees. In other words, for a given frequency, a desired internal localized reflection with predetermined magnitude and phase is achieved so that the SAW directionality is substantially to the right. It is important to note that the transducer's 10 reflection strength can be changed to any predetermined value both in magnitude and phase by changing the recessed dot pattern or the recessed dot depth without changing the electrode finger sequence.

For example, by changing the recessed dot pattern of the transducer 10 for a given sampling rate and electrode finger sequence, a wide range of transducer reflection values both in magnitude and phase can be implemented. Using a software program that calculates the optimal transduction and reflection of the transducer 10 in both magnitude and phase for any given sampling rate and electrode finger sequence, a desired topology of the transducer 10 can be ascertained. The program uses an iterative method to calculate the locations, depths and densities of the recessed gap structures (22,24) that will result in a best approximation of the desired reflectivity of the transducer 10 in phase and magnitude. Each iteration involves refining the recessed dot pattern based on the desired criteria that the reflection and transduction centers of the transducer 10 are shifted spatially by plus or minus 45 degrees, as selectively determined by sampling rate, electrode finger sequence, substrate characteristics and electrode material characteristics. The transduction center of the transducer 10 is determined by summing the electrical excitation both in magnitude and phase at each finger gap over one period of the transduction length 18. And the reflection center of the transducer 10 is determined by summing the reflections at each reflective structure (22,24) both in the magnitude and the phase due to the electrical excitation at each finger gap over one period of the transduction length 18. As a result, there may exist one or more recessed dot patterns in the transducer 10 that satisfy the condition of unidirectionality by having the reflection and the transduction centers of the SAW shifted spatially in phase by plus or minus 45 degrees. Again, the reflection strength may be different depending on the recessed dot pattern, a characteristic that provides more flexibility in designing RDSPUDT filters like those shown in FIG. 1c that have different reflection strength requirements.

Referring still to FIGS. 1a and 1b, it is important to note that although the reflectivity of the gap structures (22, 24) is primarily a function of the recessed dot density, pattern and depth, the electrode finger 14 thickness (h), to a lesser extent, also affects the reflectivity of the gap structures (22, 24). In other words, the location of each recessed gap structure (22,24) within the transducer 10, the recessed gap depth and density (i.e., percentage of the gap that is recessed) along with the electrode thickness (h) can affect the magnitude and phase of the overall reflection. Thus, to achieve unidirectionality in the present example for a given electrode finger metal thickness (h) and recessed gap depth (2t), the recessed gap density at gaps numbered 1, 4, 5, and 6 (see FIG. 1a) must be designed such that the reflections at gaps 1 and 6 are one-half the reflections at gaps 4 and 5. Additionally, for a given recessed gap depth, the transducer 10 reflection strength can be adjusted by proportionally changing the recessed gap density at the structures (22, 24) without changing the transducer 10 directionality. It is also important to note that the type of electrode metal material and the substrate material used may likewise affect the reflection directionality of the RDSPUDT transducer 10.

Since the RDSPUDT transducer structure 10 reflectivity is a function of the recess dot depth, pattern and density, and to a lesser extent, the electrode finger metal thickness (h) several advantages are afforded. For example, only one recessed gap depth is required throughout the transducer 10 to achieve unidirectionality. Unlike other prior art approaches, this approach eliminates the heavy metal loading side effects that arise by depositing very heavy metal fingers to implement a strong transducer reflection. And both electrode finger metal thickness and recessed gap depth can be adjusted independently to design a wide range of transducer reflection. Also, unlike other prior art approaches, the RDSPUDT 10 reflection implementation accuracy does not depend on an e-beam address size, but instead depends on the transducer aperture and the minimum gap width. For example, an RDSPUDT 10 with a 100 $\mu$m aperture and a 0.6 $\mu$m gap width provides at least 80 discrete steps for the 50% recessed gap for reflection implementation and much more with wider aperature, 100 $\mu$m per aperature/0.6 $\mu$m per step)*50% aperature=83 steps. As a result, because a higher resolution exists to define the groove gap density more accurately, the reflection function implementation accuracy of the RDSPUDT is better than conventional DSPUDT approaches. And also, unlike other prior art approaches, for a given metal thickness (h) and operating frequency, the RDSPUDT reflectivity can be increased by increasing the recessed gap depth without changing the critical dimension of the transducer 10. This is a significant advantage over conventional DSPUDTs since the DSPUDT typically can only achieve strong reflectivity by more dithering, and more dithering reduces the critical dimension of the transducer 10 which limits the highest achievable operating frequency.

Figure 1C:
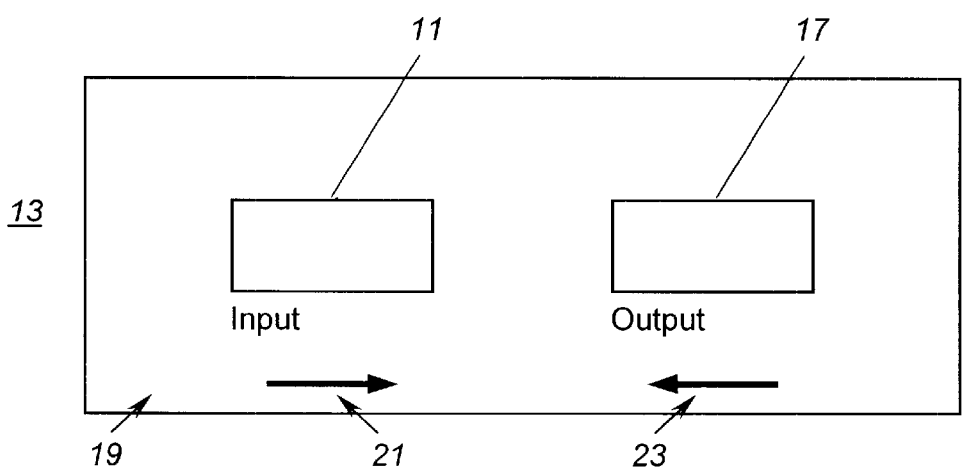
FIG. 1c is a top view illustration of a recessed dot single-phase unidirectional transducer RDSPUDT surface acoustic wave (SAW) filter in accordance with a preferred embodiment of the present invention.

Referring now to FIG. 1c, a transducer 11 is constructed by combining a series of transducers 10 (each acting as a unit cell) that share the same electrode pads (not shown). The transducer 11 can have a predetermined distributed internal reflection function, for example, by varying the reflective recessed dot structures (22, 24) densities proportionally at each unit cell 10, thus providing a near analogue implementation of the desired reflection function in magnitude and phase throughout the entire transducer 11. And the transduction function of the transducer 11, which is determined by the electrode finger pattern, can be designed independently from the transducer's 11 reflection function.

If the reflection function of the transducer 11 is designed properly, the transducer 11 will be unidirectional with the SAW propagation moving substantially to the right as shown by numeral 21. By fabricating a second transducer 17 adjacent to the transducer 10 on the same piezoelectric substrate 19, a SAW filter 13 may be formed. More particularly, by rearranging the reflective structures of the transducer 11, the transducer electrode finger sequence and recessed dot pattern of the transducer 17 are fabricated as mirror images of the original transducer 11. As a result, the SAW directionality of the transducer 17, here substantially to the left as shown by numeral 23, is the reverse of the SAW directionality of the transducer 11 where the SAW from each transducer (11, 17) propagates substantially towards the other. If the transducer reflection function of each transducer (11, 17) is designed properly, the filter 13 can be low loss since most SAW energy launched by the input transducer 11 is received by the output transducer 17. The filter 13 can also have minimal triple transit because the regenerated SAW at the output transducer 17 is cancelled by the reflection of the output transducer 17. Moreover, the filter 13 can be created by maintaining a sampling rate of the transducer 11 that is different from a sampling rate of the transducer 17. And, if the sampling periods of the two transducers (11, 17) are selectively chosen so that the out-of-band response of each transducer are at different frequencies, the combined out-of-band response may be significantly reduced as a natural consequence of the Fourier transform product of the two values, and the center frequency will be minimally affected.

Figure 2A:
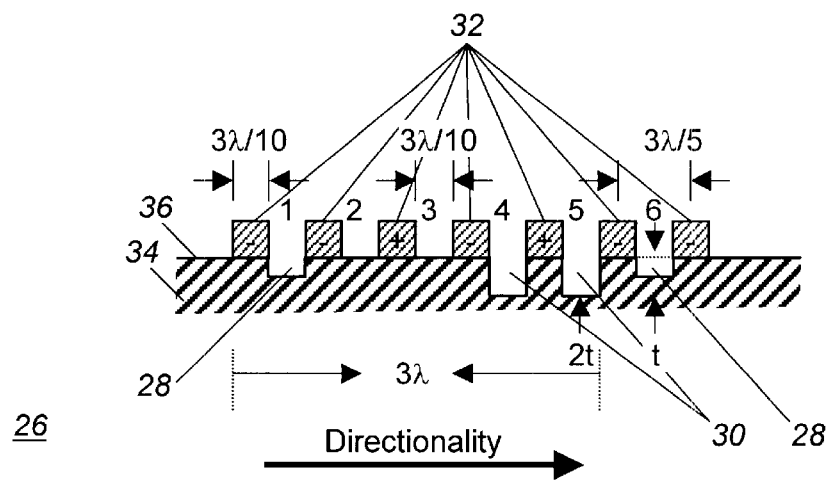
FIG. 2a is a side cross-sectional view illustration of a recessed gap single-phase unidirectional transducer (RGSPUDT) in accordance with an alternate embodiment of the present invention.
Figure 2B:
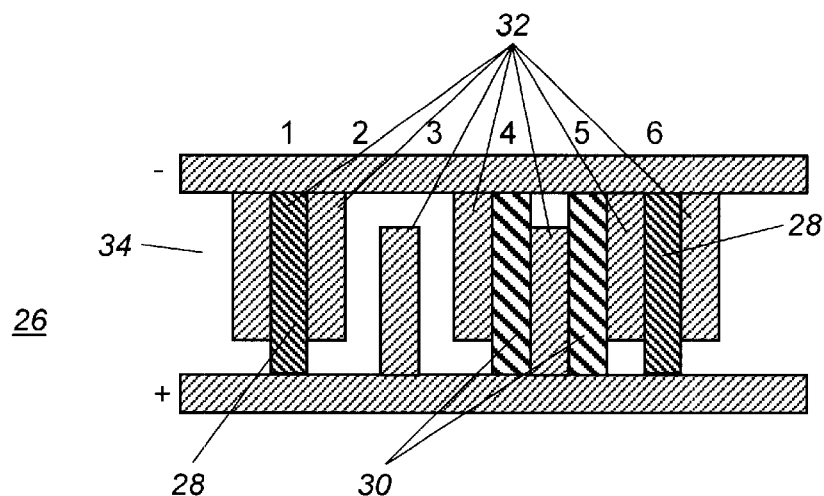

Referring now to FIG. 2, in accordance with an alternate embodiment of the present invention, a surface acoustic wave transducer 26, herein referenced as a recessed gap single-phase unidirectional transducer (RGSPUDT) 26, is illustrated in FIG. 2a in side cross-sectional view and in FIG. 2b in top view. In the present example, the transducer 26 has similar components and operation as the RDSPUDT 10 illustrated in FIG. 1 except that the RGSPUDTs 26 unidirectionality is achieved by selectively etching continuous (100% of gap recessed) reflective recessed gap structures (28,30) at varying depths throughout the entire transducer 26. In other words, here the transducer reflection is affected not by varying the recessed gap densities as described in the FIG. 1 embodiment, but by varying the depths of the selected recessed gap structures (28, 30) to achieve a desired reflection function. However, alternatively, the recessed gap structures (28,30) can be replaced by electrically insulated material (not shown) deposited on the substrate surface 36, impurities (not shown) ion-implanted into the surface 36, or any other structural disturbance that can create surface acoustic wave (SAW) reflections.

Referring to FIGS. 2a and 2b, the RGSPUDT 26 includes a pattern of interdigitated electrodes 32 on a piezoelectric substrate 34 in a $3\lambda/5$ uniform grid. Each electrode 32 has a width of approximately $3\lambda/10$, each gap numbered 1 through 6 has a width of approximately $3\lambda/10$ and adjacent electrodes 32 have a center to center spacing of approximately $3\lambda/5$. Similar to the FIG. 1 embodiment, the reflectivity of the recessed gap structures 28 at gap positions numbered 1 and 6 are formed having one-half the reflectivity of recessed gap structures 30 at gap positions numbered 4 and 5. In other words, the depth (t) of recessed gap structures 28 located at positions numbered 1 and 6 are approximately one-half the depth (2t) of recessed gap structures 30 located at positions numbered 4 and 5. Thus, a recessed gap pattern is periodic throughout the entire transducer and is defined as (0.5, 0, 0, 1, 1) which represents the relative recessed gap depth at each gap (from left to right) in one period of $3\lambda$ of the transducer 26—zero meaning the corresponding gap is not recessed. It is important to note that the value of (t) can be changed continuously to obtain a continuous change in reflectivity strength without affecting the transducer directionality so long as the recessed gap pattern remains unchanged. It is also important to note that the reflectivity (transducer reflection strength) of the recessed gap structures (28, 30) can be changed to any predetermined value both in magnitude and phase by changing the recessed gap pattern, the gap depth or the electrode finger thickness of the transducer 26 without changing the electrode finger sequence. Thus, for a given electrode finger thickness (h), the gap depths at gaps 1, 4, 5, and 6 must be designed in such a way that maintains the reflectivity at gaps 1 and 6 at one-half the reflectivity at gaps 4 and 5.

For example, by changing the recessed gap pattern of the transducer 26 for a given sampling rate and electrode finger sequence, a wide range of transducer reflection values both in magnitude and phase can be implemented. As with the FIG. 1 embodiment, any desired sampling rate, electrode finger sequence and electrode width can be used in the present example, so long as a pattern of uniform-width, uniformly spaced electrodes 32 are formed on the surface 36 of the substrate 34. The software program described in the FIG. 1 embodiment is used again here to calculate the optimal transduction and reflection centers of the transducer 26 to determine a desired transducer topology for any given sampling rate and electrode finger sequence. Thus, a different recessed gap pattern can be achieved by having an entirely new pattern that is different from the original pattern. As a result, there may exist one or more recessed gap patterns in the transducer 26 that satisfy the condition of unidirectionality where the reflection and transduction centers of the SAW are shifted spatially in phase by plus or minus 45 degrees. Moreover, the reflection strength may be different for a different recessed gap pattern. This characteristic provides more flexibility to design RGSPUDT filters like those shown in FIG. 2c that have different reflection strength requirements.

Figure 2C:
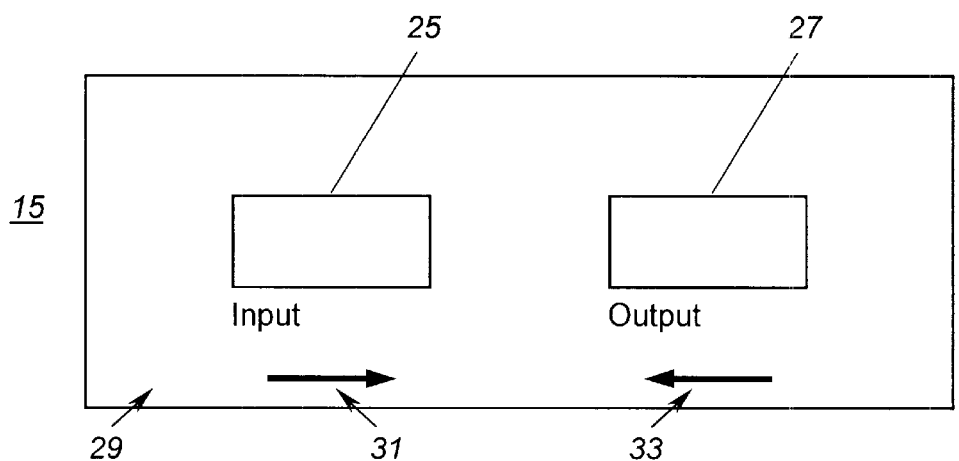
FIG. 2c is a top view illustration of a recessed gap single-phase unidirectional transducer RGSPUDT surface acoustic wave (SAW) filter in accordance with a preferred embodiment of the present invention.

Referring to FIG. 2c, a transducer 25 may be constructed having a predetermined distributed internal reflection function by combining a series of transducers 26, each acting as a unit cell, that share the same electrode pads (not shown). This predetermined distributed internal reflection function is achieved by varying the depths of the recessed gap structures (28, 30) at each unit cell 26, thus providing a near analogue implementation of the desired reflection function in both magnitude and phase throughout the entire transducer 25. However, for practical purposes, it may be desirable to minimize the number of different recessed gap depths to control the complexity of the fabrication process. In the present example, there are two different recessed gap depths (t) and (2t), each 100% recessed. Thus, unlike the RDSPUDT shown in FIG. 1 where the reflectivity of each unit cell (see numeral 10) can be adjusted arbitrarily, the reflectivity of each unit cell 26 here is fixed. So to provide a desired transduction or reflection characteristic, an approximation of the desired transducer reflection function can be implemented by an approach called withdrawal weighting. The withdrawal weighting is a commonly used weighting function in SAW filter design in which the reflective structures (28, 30) at certain gaps are selectively removed or repositioned so that an approximation of the original reflection function is implemented. Moreover, the transducer transduction can be designed independently from the transducer reflection function.

If the reflection function of the transducer 25 is designed properly, the transducer 25 will be unidirectional with the SAW propagation moving substantially to the right as shown by numeral 31. And, as a result, a SAW filter 15 may be formed by fabricating a second transducer 27 adjacent to the transducer 25 on the same piezoelectric substrate 29. More particularly, by rearranging the reflective structures (28, 30) of the transducer 25, a transducer electrode finger sequence and recessed dot pattern of the transducer 27 are fabricated as mirror images of the original transducer 25. As a result, the SAW directionality of the transducer 27, here substantially to the left as shown by numeral 33, is the reverse of the SAW directionality of the transducer 25 where the SAW from each of the transducers (25, 27) propagates substantially towards the other. If the reflection function of each transducer (25, 27) is designed properly, the filter 15 can be low loss since most of the SAW energy launched by the input transducer 25 is received by the output transducer 27. The filter 15 can also have minimal triple transit since the regenerated SAW at the output transducer 27 is cancelled by the reflection of the output transducer 27. Moreover, similar to the filter 13 previously described and illustrated in FIG. 1, the sampling rate of the transducer 25 may be different from the sampling rate of the transducer 27. And, if the sampling periods of the two transducers (25, 27) are selectively chosen so that the out-of-band response of each transducer (25, 27) is at different frequencies, the combined out-of-band response may be significantly reduced as a natural consequence of the Fourier transform product of the two out-of-band response values, and the center frequency will be minimally affected.

Figure 3A:
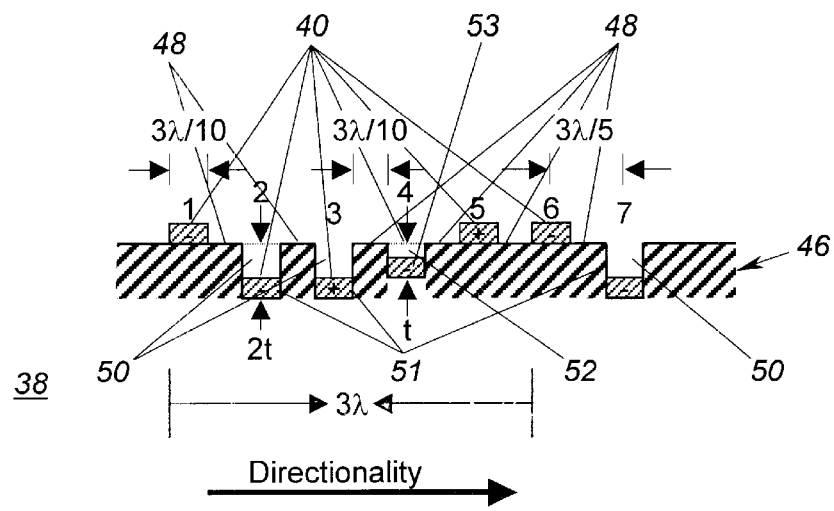
FIG. 3a is a side cross-sectional view illustration of a recessed finger single-phase unidirectional transducer (RFSPUDT) in accordance with an alternate embodiment of the present invention.
Figure 3B:
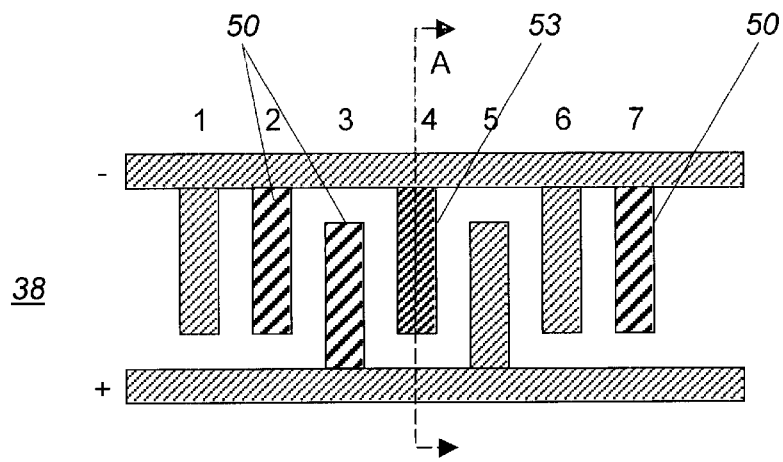

Referring next to FIG. 3, in an additional embodiment of the present invention, a surface acoustic wave transducer 38, herein referenced as a recessed finger single-phase unidirectional transducer (RFSPUDT), is illustrated in side cross-sectional view in FIG. 3a and in top view in FIG. 3b. In the present example, like examples previously discussed, the transducer 38 includes a pattern of interdigitated electrodes 40 formed on a piezoelectric substrate 46 in a $3\lambda/5$ uniform grid. Each electrode 40 has a width of approximately $3\lambda/10$, adjacent electrodes 40 have a center to center spacing of approximately $3\lambda/5$, and each gap 48 located between adjacent electrodes has a width of approximately $3\lambda/10$.

Referring to FIGS. 3a and 3b, unlike the FIG. 1 and FIG. 2 embodiments, the transducer 38 includes selected electrode fingers 40, here fingers 2, 3 and 7, which are deposited into pre-etched grooves 50 that have been completely (100%) recessed. Other selected electrode fingers 40, here only finger 4, are deposited into pre-etched grooves 52 that have also been completely (100%) recessed. The electrode fingers 40 that have been deposited into the grooves (50, 52) respectively form reflective recessed finger structures 51 and 53 that together achieve a unidirectional reflection function throughout the entire transducer 38. To generate a predetermined reflection magnitude and phase for unidirectionality, the electrode finger deposition is carried out so that at least one but not every electrode 40 is deposited in one of each of the grooves (50,52). To achieve unidirectionality substantially in one direction, the grooves (50, 52) are used throughout the entire transducer 38 and have two different groove depths (t) and approximately (2t), where t is some predetermined constant. In the present example, the transducer 38 is illustrated having a recessed electrode finger 40 within a groove 52 of depth (t) at finger position 4 that forms the recessed finger structure 53. Other recessed electrode fingers 40 are correspondingly deposited within grooves 50 of depth (2t) at finger positions 2, 3, and 7 to form recessed finger structures 51. The purpose of having the groove depth equal to (t) in the recessed finger structure 53 and approximately (2t) in the recessed finger structures 51 is to ensure that the reflection at the structure 53 is one-half the reflection at each of the structures 51. Thus, similar to previous embodiments, a recessed finger pattern is defined in the present example as (1, 1, 0.5, 0, 0) which represents the relative recessed groove depth at each electrode finger 40 (from left to right) in one period of 3λ of the transducer 38. The recessed finger pattern is periodic throughout the entire transducer 38. And, similar to the FIG. 1 and FIG. 2 embodiments, it is important to note that the transducer reflection strength of the transducer 38 can be changed to any predetermined value both in magnitude and phase by changing the recessed finger pattern, the groove depth or the electrode finger thickness.

For example, by changing the recessed finger pattern of the transducer 38 for a given sampling rate and electrode pattern, a wide range of transducer reflection values both in magnitude and phase can be implemented. As facilitated by the software program mentioned in previous embodiments, a different recessed finger pattern can be achieved by having an entirely new pattern with one or more characteristics of the pattern different from the original. As a result, there may exist one or more recessed finger patterns in the transducer 38 that satisfy the condition of unidirectionality by having the reflection and the transduction centers of the SAW shifted spatially in phase by plus or minus 45 degrees. And the reflection strength may be different for a different recessed finger pattern. This characteristic, as illustrated in FIG. 3d discussion below, provides more flexibility to design RFSPUDT filters that have different reflection strength requirements.

Figure 3C:
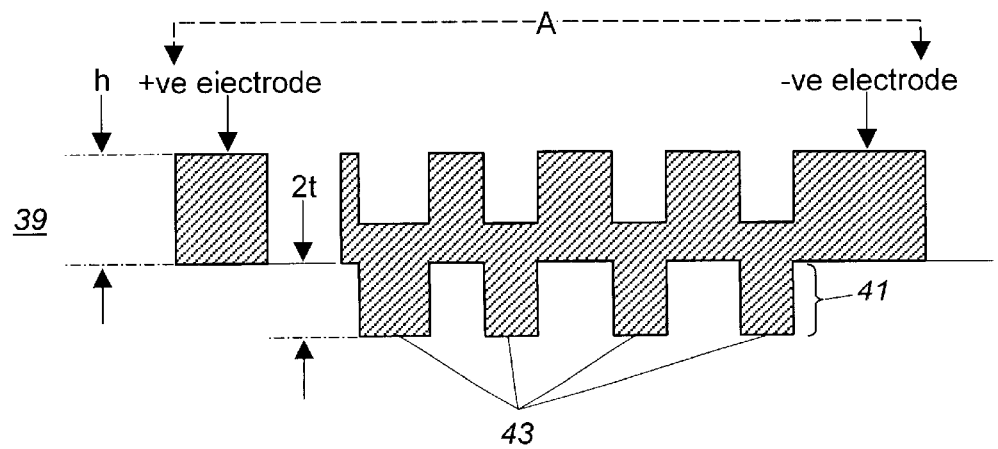
FIG. 3c is a side cross-sectional view illustration of a line cut across an axis A in FIG. 3b illustrating an alternate recessed finger structure for the case where the electrode finger thickness (h) is greater than the groove depth (t)

Referring to FIG. 3c, it is generally assumed that the electrode finger thickness (h) does not affect the groove reflection. But, as in previous embodiments, the electrode finger thickness may affect the reflection of the reflective recessed finger structures 51 so that for a given metal thickness (h), the depths of grooves 52 and 50 must be designed to ensure that the reflection at groove 52 is one-half the reflection at each of the grooves 50.

A recessed finger structure 39 is provided for a case where the electrode finger thickness (h) of the recessed finger structure 53 of FIG. 3b is greater than the depth (t) of its groove 52. The recessed finger structure 39 shown here as a cross section view of the line cut across the axis A of the finger structure 53 at finger position 4 in FIG. 3b is formed by replacing the recessed groove 52 of the structure 53 with a randomly recessed groove 41. The recessed finger structure 39 is similar to the reflective structure 22 described and illustrated in the FIG. 1 RDSPUDT in that the structure 39 is formed by selectively etching multiple randomly distributed recesses (groove dots) 43 to a depth (2t) at finger position 4. And similar to the gap positions numbered 1 through 6 of the FIG. 1 RDSPUDT, the groove 41 here is formed so that only approximately 50% of groove 41 is recessed, thus giving the groove 41 a dot density of 0.5 which is one-half the densities at the recessed finger structures 50. It is important to note that the present invention is not limited to the recesses 43 being etched within a particular groove (50, 52) of the transducer 38.

Figure 3D:
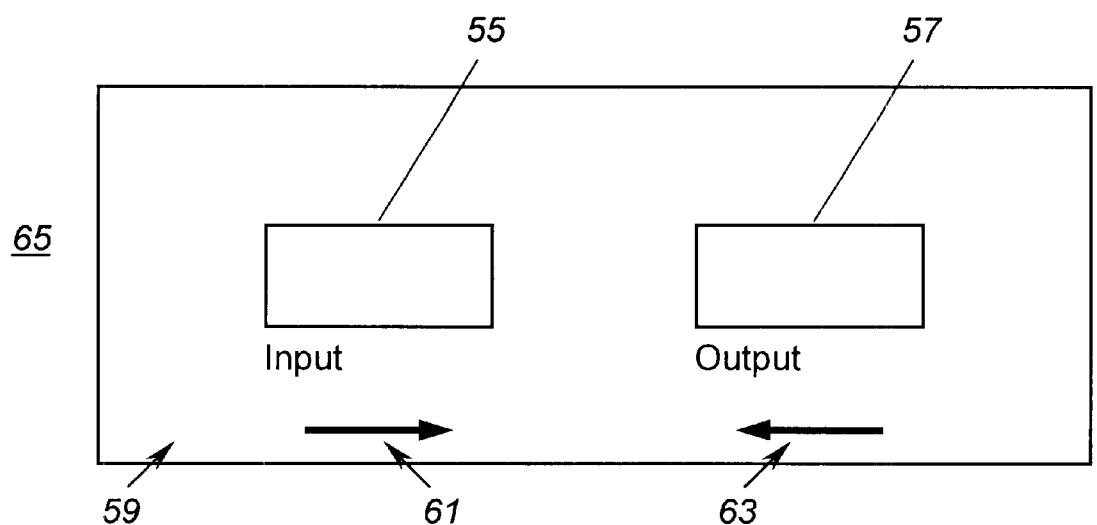
FIG. 3d is a top view illustration of a recessed finger single-phase unidirectional transducer RFSPUDT surface acoustic wave (SAW) filter in accordance with a preferred embodiment of the present invention.

Referring to FIG. 3d, a transducer 55 may be constructed by combining a series of transducers 38 (each acting as a unit cell). The series of unit cells 38 can each share the same electrode pads (not shown) and achieve a predetermined distributed internal reflection function by varying the depths of the recessed grooves (50, 52) at each unit cell 38. This provides a near analogue implementation of the desired reflection function in both magnitude and phase throughout the entire transducer 55. Like the RGSPUDT previously described in FIG. 2, it is desirable to minimize the number of different groove depths across the unit cells 38 of the transducer 55. Thus, in the present example two groove depths (t) and (2t) are preferred, each completely (100%) recessed to form the recessed finger structures (51, 53). As a result, the reflectivity of each unit cell 38 is fixed and cannot be adjusted arbitrarily unlike with the RDSPUDT described in FIG. 1. And to provide a desired transduction or reflection characteristic, an approximation of the desired transducer reflection function can be implemented by withdrawal weighting as described in previous embodiments.

The transducer transduction function can be designed independently from the transducer reflection function. And if the transducer reflection function is designed properly, the transducer 55, which has been formed by the series of unit cells 38, will be unidirectional with the SAW propagating substantially to the right as shown by numeral 61. To form a second transducer 57, the SAW directionality of the original transducer 55 can be reversed by rearranging the reflective structures (51, 53) of each unit cell 38 in such a way that the rearranged transducer electrode finger sequence and recessed finger patterns are mirror images of that of the original transducer 55. When the transducer 57 is fabricated adjacent to the first transducer 55 on the same piezoelectric substrate 59, a SAW filter 65 may be formed with the SAW from each transducer (55, 57) propagating toward the other. Moreover, if the transducer reflection function of each transducer (55, 57) is designed properly, the filter 65 can be low loss since most SAW energy launched by the input transducer 55 is received by the output transducer 57. The filter 65 can also have minimal triple transit. And additionally, similar to the filters previously described and illustrated in the FIG. 1 and FIG. 2 embodiments, the sampling rate of the transducer 55 may be different from the sampling rate of the transducer 57. And, if the sampling periods of the two transducers (55, 57) are selectively chosen so that the out-of-band responses of each transducer (55, 57) are at different frequencies, the combined out-of-band response may be significantly reduced as a natural consequence of the Fourier transform product of the two out-of-band response values, and the center frequency will be minimally affected.

Referring still to FIG. 3d, it is important to note that the principles of the present embodiment are also applicable in cases where the metal thickness (h) is greater than the groove depth (2t). Here, only one groove depth is required throughout the entire transducer 55 and, as a result, the complexity of the fabrication process in reduced. It is also important to note that instead of using an approximate withdrawal weighting approach, a more accurate implementation of the transducer reflection function of the transducers (55, 57) can be achieved here by varying the groove dot densities in each unit cell 38. This is accomplished using methods similar to those described in the FIG. 1 RDSPUDT embodiment.

Finally, the present invention provides, in general aspect, methods for producing the RRSPUDT transducers (RDSPUDT, RGSPUDT, RFSPUDT) previously described and illustrated in FIGS. 1 through 3. More specifically, and with reference to the FIG. 4 through FIG. 7 drawings, methods for producing RDSPUDT, RGSPUDT, and RFSPUDT structures are provided that mitigate the effects of mask alignment errors occurring during the photolithography processing steps. By creating intermediate structures (described in detail below) on the surface of a substrate during the photolithography processing steps, any mask alignment errors as large as plus or minus one-half of the critical geometry (electrode finger width or gap width) of the transducer can be tolerated without affecting the positioning of the transducer's reflective structures. This is critical, since if the locations of the reflective structures are not precisely located with respect to the electrode fingers, the electrical performance of the transducer will suffer.

It is important to note that the principles of the present invention are not limited to the particular photolithography processing techniques described in FIGS. 4, 5, 6 and 7 below. Instead, the present invention only requires that by using any one of a number of photolithography processing techniques, intermediate structures be formed at a particular point within the sequence of processing steps to ensure proper positioning of the electrode fingers relative to the transducer's reflective structures.

Referring to FIG. 4, a method for fabricating an RDSPUDT type transducer is shown. The final structure (see FIG. 4i) of an RDSPUDT type transducer consists of an electrode finger pattern 70 and reflective recessed gap structures 76 located at a selected gaps within the pattern of electrode fingers 70, therefore, two photolithography processing masks are required to fabricate the transducer. The first mask is used to define the electrode finger pattern 70 on the surface of the substrate, and the second mask is used to define the reflective recessed gap structure pattern 76 on the surface of the substrate. As previously emphasized, if the reflective structures 76 of the transducer are not precisely positioned, especially as a result of mask alignment error, the performance of the transducer will suffer. Therefore, by creating an intermediate structure like the structure 67 shown in FIG. 4d, the alignment error between the first and the second mask can be as large as plus or minus one-half of the finger width or gap width of the transducer without affecting the positioning of the reflective recessed gap structures 76. The intermediate structure 67 compensates for mask alignment errors since the positions of both the electrode fingers 70 and the recessed gaps 76 are inherently defined by the intermediate structure.

Figure 4A:
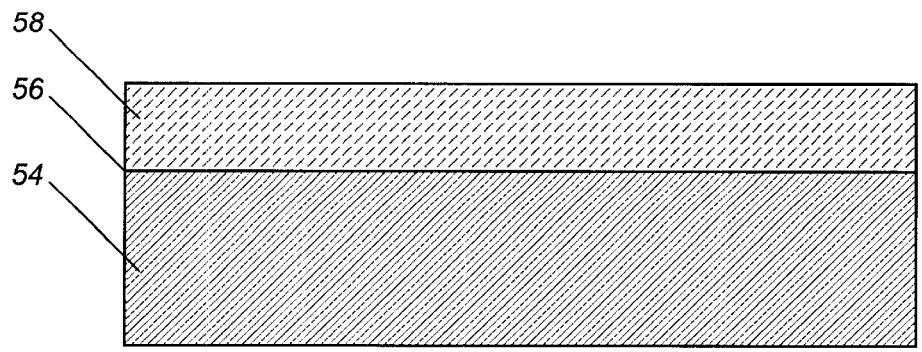
FIGS. 4a through 4i are side cross-sectional view illustrations of a fabrication method of an RDSPUDT of the present invention.
Figure 4B:
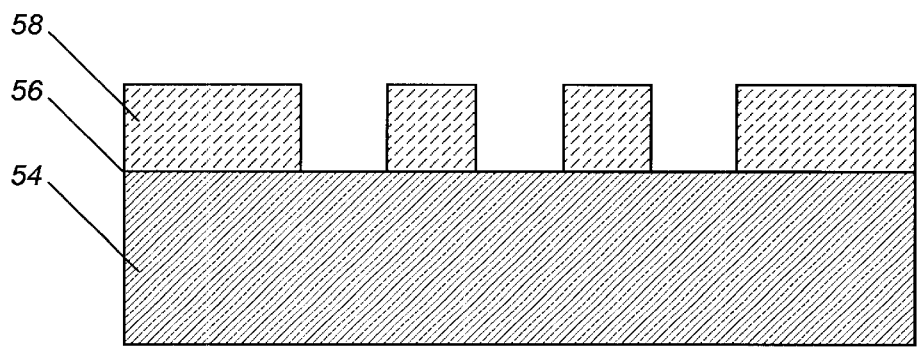

Referring to FIGS. 4a and 4b, respectively, using standard photolithography processing techniques, a layer 58 of photoresist is coated over the entire surface 56 of the a piezoelectric substrate 54. As shown in FIG. 4b, the photoresist layer 58 is then exposed to an ultra violet (UV) light source (not shown) through a first mask (not shown) to transfer an electrode finger pattern of the first mask to the photoresist layer 58.

Figure 4C:
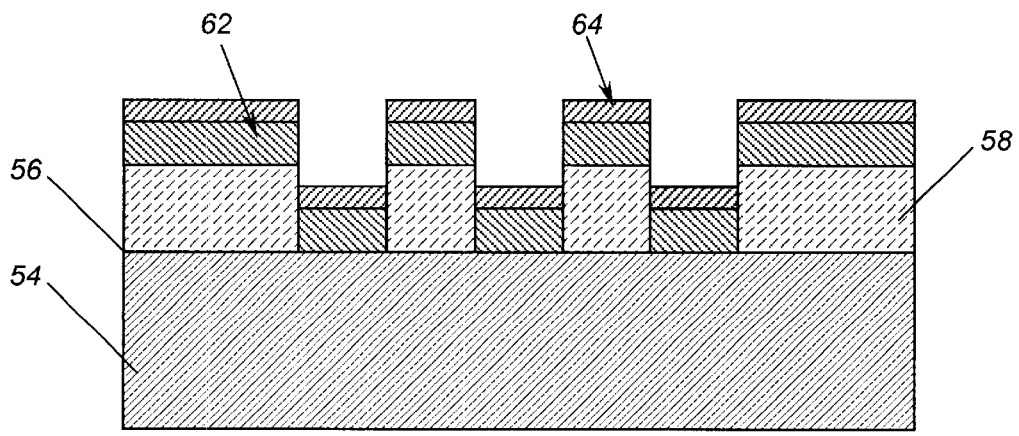

Referring to FIG. 4c, using a deposition technique, which may include e-beam evaporation, a layer 62 of metal (e.g. aluminum (Al) film) is deposited over the entire substrate surface 56, and a barrier layer 64 (e.g. titanium (Ti)) is deposited over the metal layer 62. The barrier layer 64 thickness is chosen so that a sufficient amount of the layer 64 remains following the formation of the recessed gaps that are described in detail below.

Figure 4D:
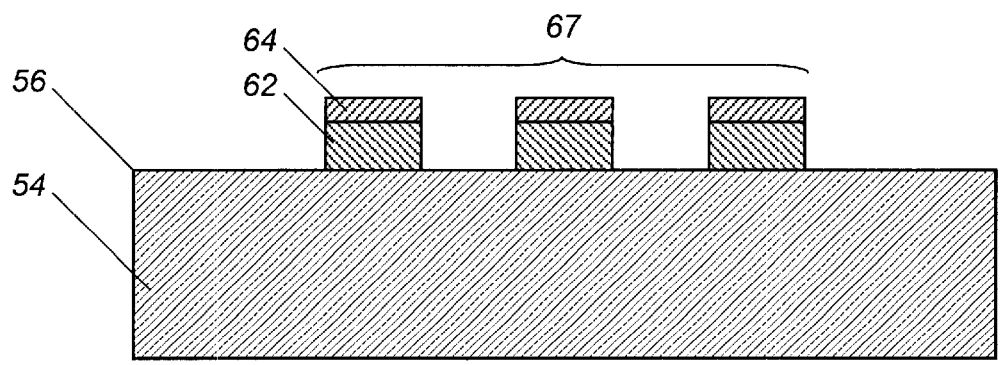

Next, as shown in FIG. 4d, the photoresist layer 58 is "lifted-off" the substrate surface 56 leaving a pattern of the metal layer and barrier layer (62,64) to form an intermediate structure 67. As will become apparent in subsequent processing steps, the intermediate structure 67 precisely and naturally defines the positions of both the electrode fingers 70 and the reflective recessed gap structures 76.

Figure 4E:
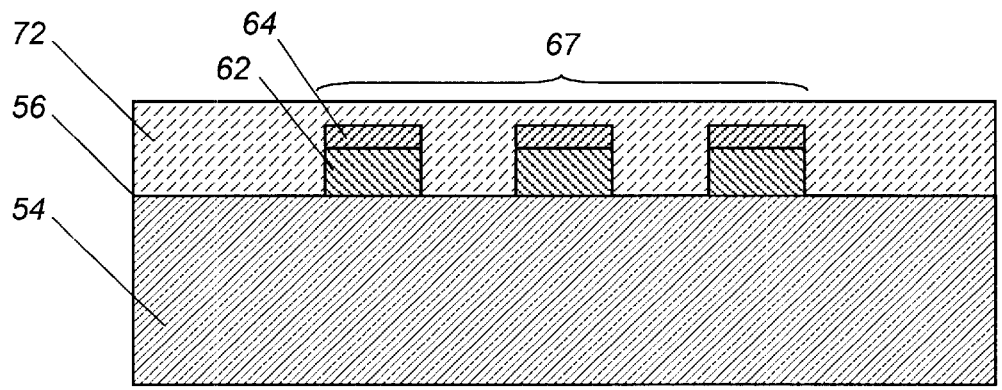
Figure 4F:
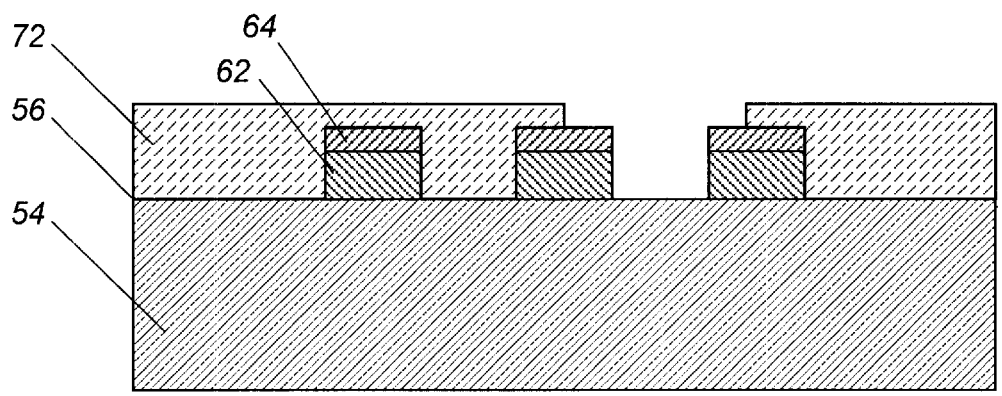

Referring to FIGS. 4e and 4f, respectively, to begin forming the pattern of reflective recessed gap structures 76 on the substrate surface 56, the substrate surface 56 is coated with a second layer 72 of photoresist. As shown in FIG. 4f, a second mask (not shown) is aligned to the substrate surface 56, and the second layer of photoresist layer 72 is exposed to an ultra violet (UV) light source (not shown) through the second mask and developed to transfer the pattern of reflective recessed gap structures of the second mask to the photoresist layer 72.

Figure 4G:
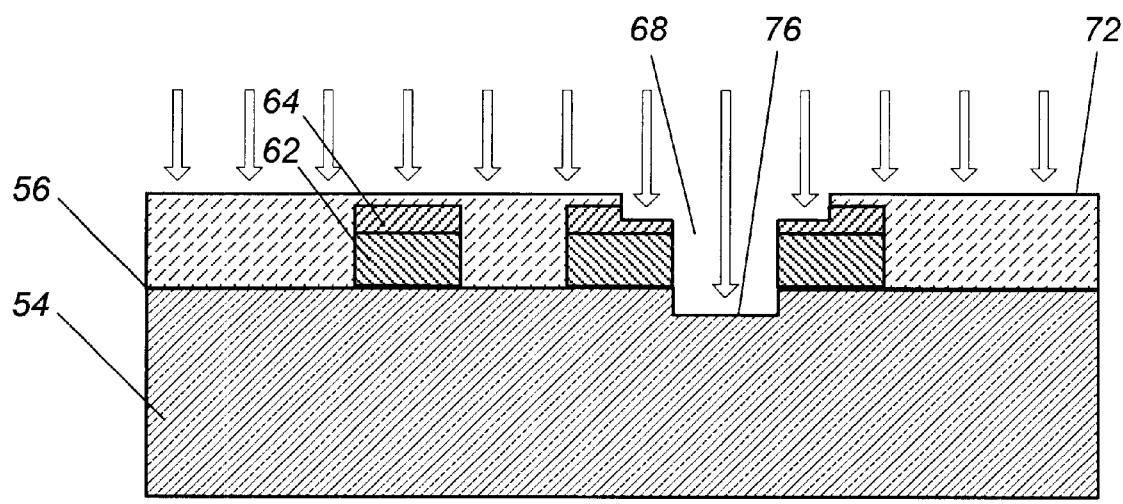
Figure 4H:
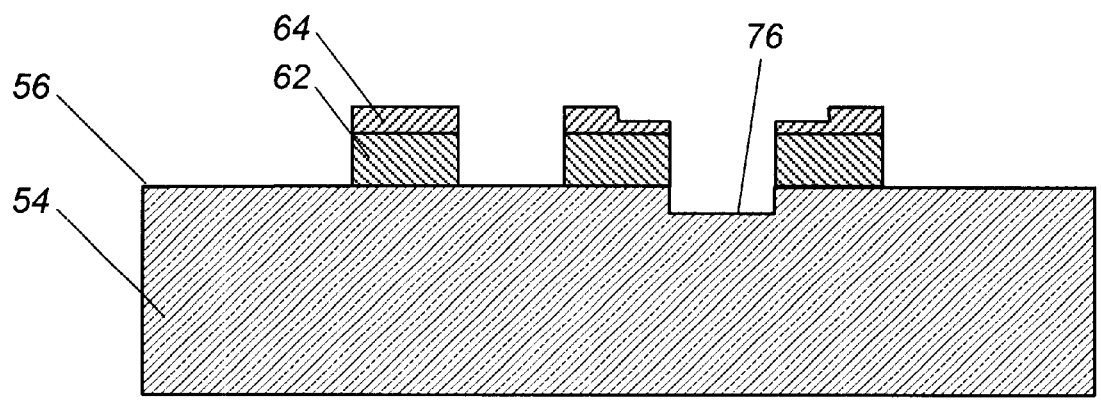
Figure 4I:
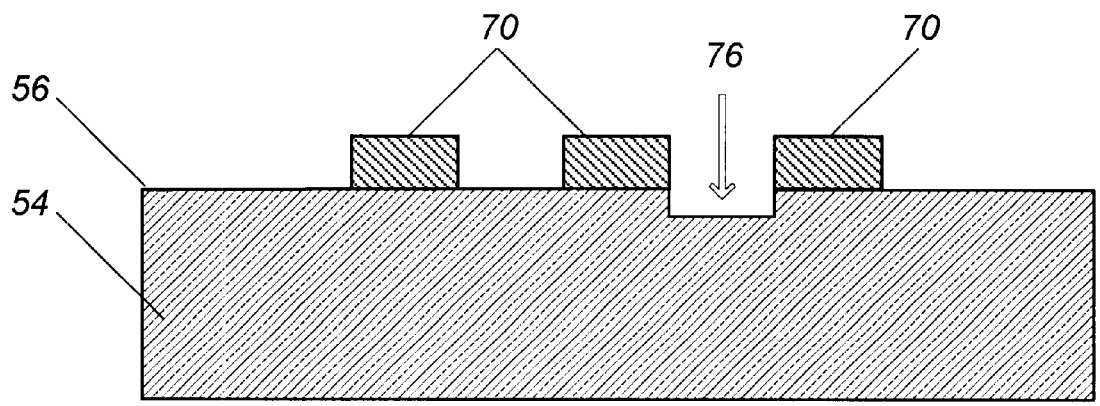

Next, as shown in FIGS. 4g and 4h, respectively, using wet chemical etching techniques or dry etching techniques such as ion-beam etching, the substrate surface 56 is etched to form a reflective recessed gap structure 76 within a gap 68 formed by the pattern of photoresist layer 72. Following etching, as shown in FIG. 4h, the photoresist layer 72 is removed from the substrate 54. Referring to FIG. 4i, the barrier layer 64 is removed from the substrate 54, thereby exposing a pattern of electrode fingers 70 and the reflective recessed gap structure 76 on the substrate surface 56.

Alternatively, referring to FIG. 5, another method of fabricating an RDSPUDT type transducer illustrated in FIG. 4 is shown. Beginning with FIG. 5a, a layer of metal film 100 such aluminum is deposited over a surface 103 of a piezoelectric substrate 102 using techniques that may include sputtering or e-beam evaporation and a layer of photoresist 104 is coated over the metal layer 100.

Figure 5A:
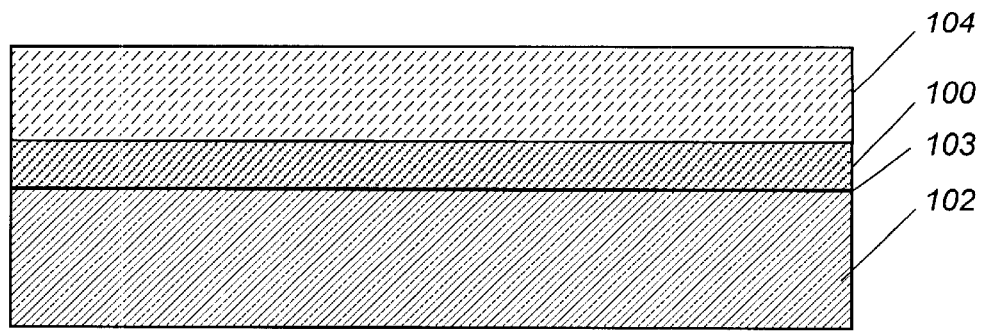
FIGS. 5a through 5g are side cross-sectional view illustrations of a fabrication method of an RDSPUDT of the present invention.
Figure 5B:
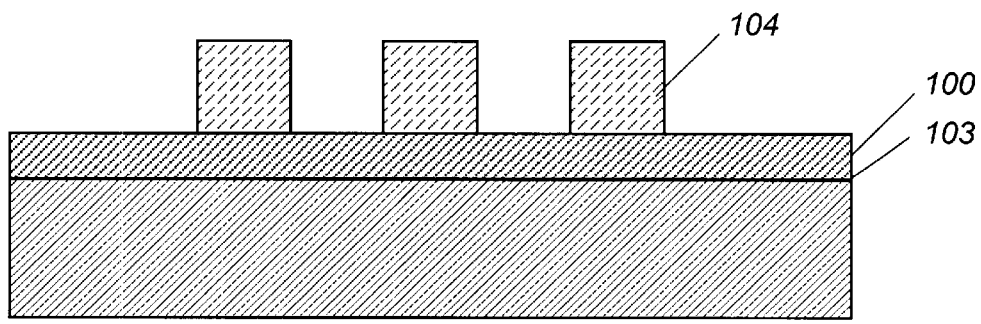

Referring to FIG. 5b, the photoresist layer 104 is exposed to UV light through a first mask (not shown) to transfer an electrode finger pattern of the mask to the photoresist layer 104. The photoresist layer 104 functions as a barrier layer during subsequent etching steps.

Figure 5C:
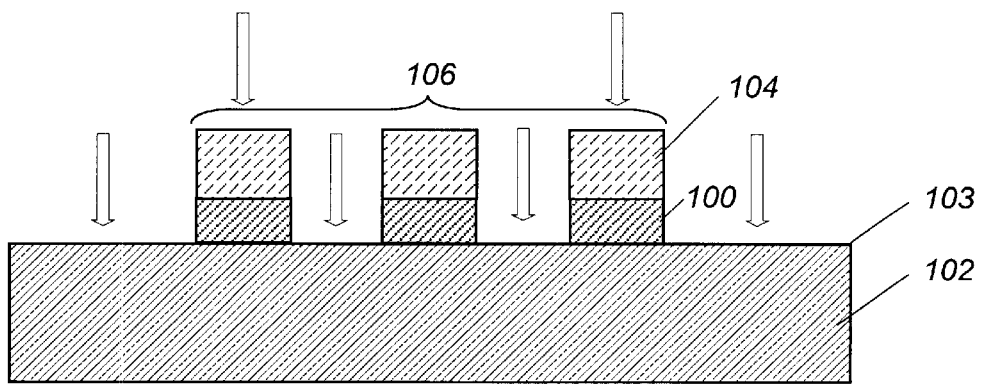

Referring to FIG. 5c, using etching techniques such as ion beam or reactive ion beam etching, a key intermediate structure 106 is formed from the photoresist barrier layer 104 and the metal layer 100. Here, as in the previous example, the intermediate structure 106 will allow the alignment tolerance of subsequent masks to be up to plus or minus one-half of the critical geometry of the transducer without affecting the performance of the transducer.

Figure 5D:
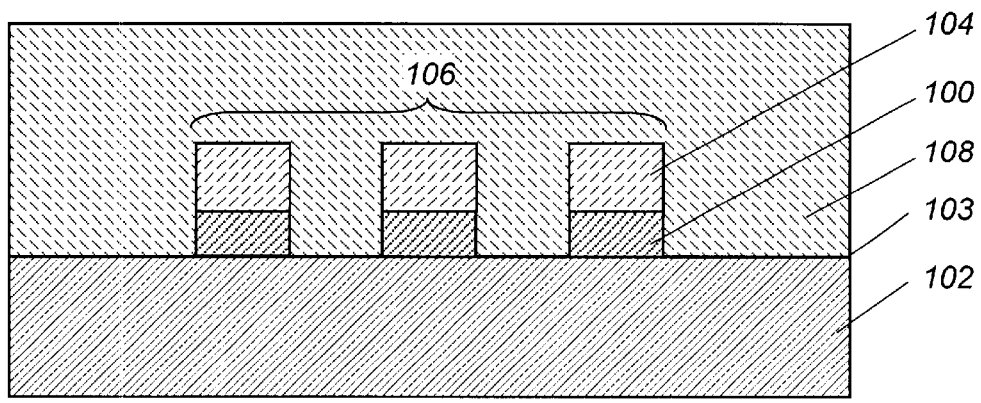

Next, referring to FIG. 5d, the photoresist barrier layer 104 is hardened to prevent it from being developed in subsequent processing steps and the substrate surface 103 is coated with a second layer of photoresist material 108.

Figure 5E:
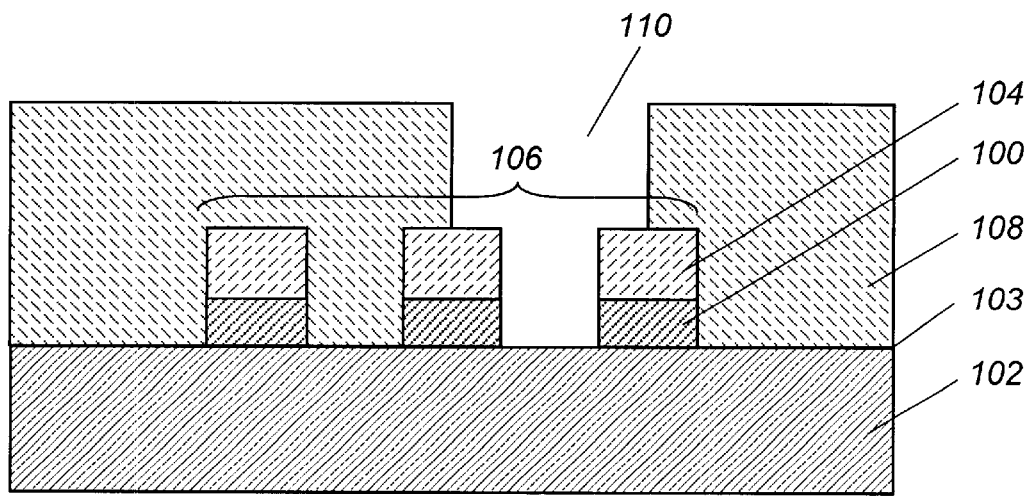

Referring to FIG. 5e, a second mask (not shown) is aligned to the substrate surface 103 and the second photoresist layer 108 is exposed to UV light through the second mask (not shown) to transfer a reflective recessed gap structure pattern from the second mask to the second photoresist layer 108.

Figure 5F:
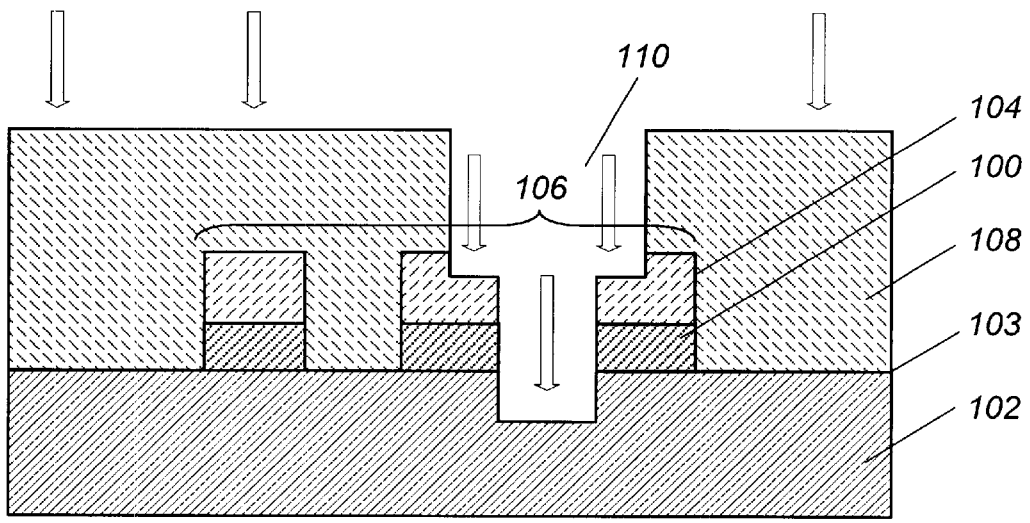

Referring to FIG. 5f, using an etching technique such as ion beam etching, the substrate surface 103 is etched to form a reflective recessed gap structure 112 within a gap 110 formed by the pattern of the second photoresist layer 108.

Figure 5G:
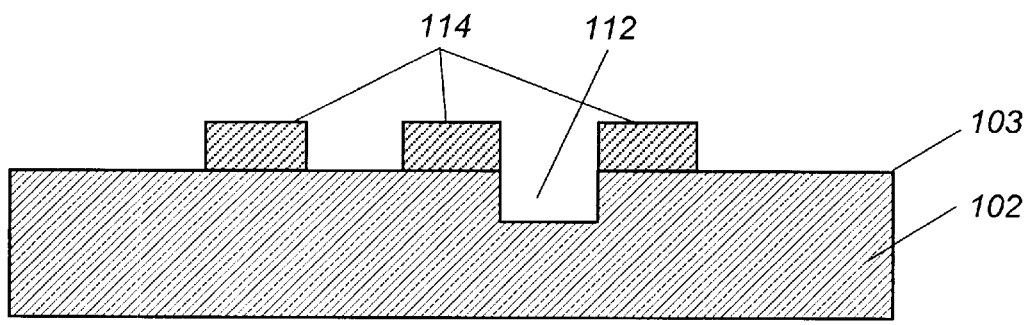

Referring to FIG. 5g, following the etching step, the first and second layers of photoresist (104, 108) are removed from the substrate 102 thereby exposing a pattern of electrode fingers 114 and the reflective recessed gap structure 112 formed on the substrate surface 103.

Referring now to FIG. 6, a method for fabricating an RFSPUDT type transducer is shown. In this example, the final structure (see FIG. 6l) of the RFSPUDT consists of a pattern of electrode fingers 98 and two types of reflective recessed finger structures (88, 94), therefore, three photolithography processing masks are required to fabricate the transducer. The first mask is used to define the electrode finger pattern 98 on a surface 79 of the substrate 78, and the second and third masks are used to define the two types of reflective recessed finger structures (88, 94), respectively.

Figure 6A:
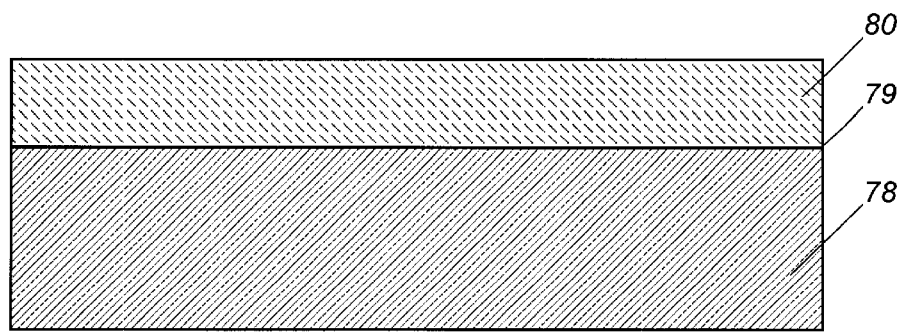
FIGS. 6a through 6l are side cross-sectional view illustrations of a fabrication method of an RFSPUDT of the present invention.
Figure 6B:
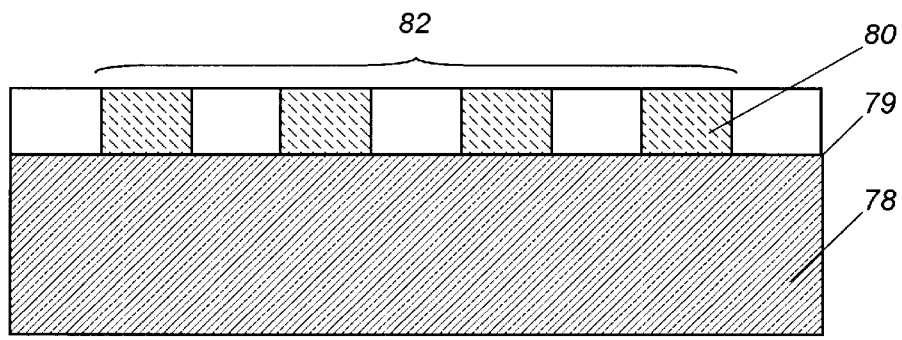

Referring to FIGS. 6a and 6b, respectively, using standard photolithography processing steps, a first layer 80 of photoresist is coated over the entire surface 79 of a piezoelectric substrate 78. The thickness of the photoresist layer 80 is chosen so that a sufficient amount of photoresist 80 remains following the formation of etched grooves (87, 89) that are described in detail below. As shown in FIG. 6b, the photoresist layer 80 is exposed to an ultra violet (UV) light source (not shown), operating at wavelength $\lambda_1$, through a first mask (not shown) to transfer an electrode finger pattern of the first mask to the photoresist layer 80. The exposure of the photoresist layer 80 is performed at a predetermined optical wavelength, $\lambda_1$, so that during subsequent exposure steps the photoresist layer 80 will not be subjected to undesired further exposure. The photoresist layer 80, by assuming the pattern of the first mask, creates a PR mask that defines a key intermediate structure 82. The positions of the reflective recessed finger structures (88, 94) and the electrode fingers 98 are inherently defined within the intermediate structure 82, therefore, any alignment errors between the first, second and third masks can be as large as plus or minus one-half of the critical geometry of the transducer without negatively impacting the electrical performance of the transducer.

Figure 6C:
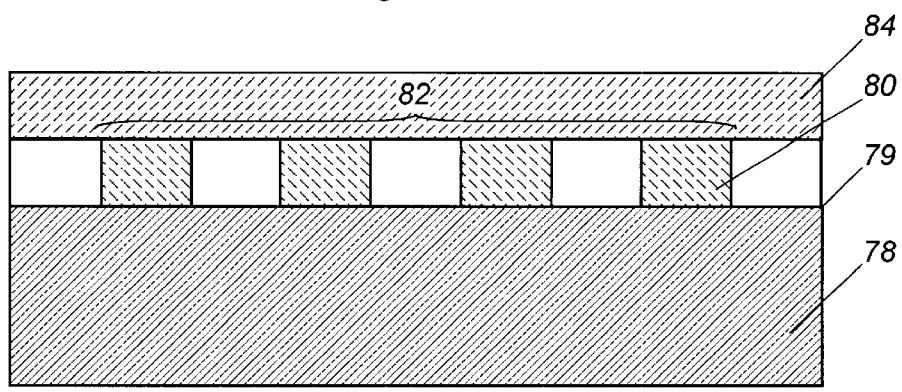
Figure 6D:
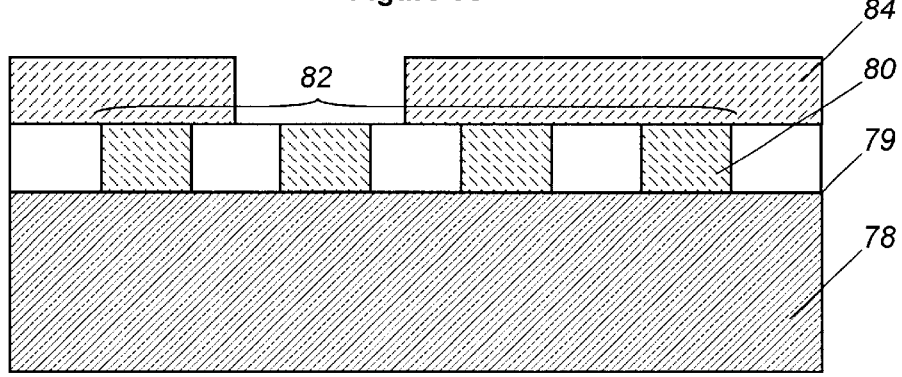

Next, as shown in FIGS. 6c and 6d, respectively, a second layer of photoresist 84 is coated over the intermediate structure 82. And, as illustrated in FIG. 6d, a second mask (not shown) is aligned to the substrate surface 79 and the second photoresist layer 84 is exposed to an ultra violet (UV) light source (not shown) operating at optical wavelength $\lambda_2$. The optical wavelength $\lambda_2$ is selected to be greater than or less than, but not equal to the value of the optical wavelength $\lambda_1$ to avoid undesired exposure of the first photoresist layer 80. Finally, the second photoresist layer 84 is developed using standard photolithography processing techniques to transfer the reflective recessed finger pattern 88 of the second mask to second photoresist layer 84. The particular developer chosen for developing the second photoresist layer 84 should be chosen to avoid simultaneously developing the first photoresist layer 80 while the development of the second photoresist layer 84 is being performed.

Figure 6E:
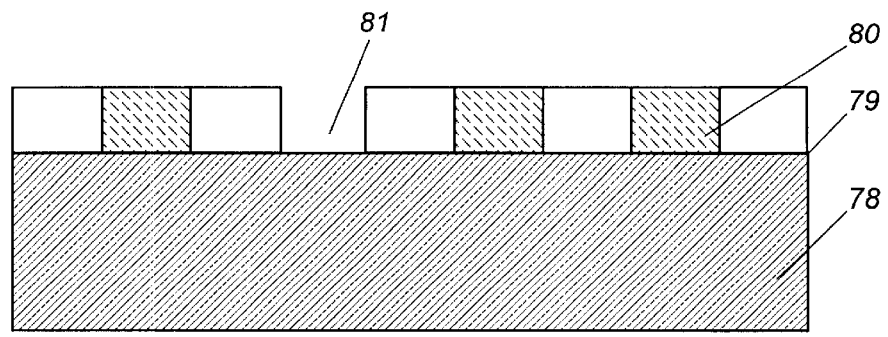

Referring to FIG. 6e, the first photoresist layer 80 is partially developed at the opening 81 using a developer that will not further develop the second photoresist layer 84—thus, the PR mask formed by the second photoresist layer 84 is formed after the mask formed by the first photoresist layer 80 is developed. Next, the second photoresist layer 84 is removed using a solvent that does not dissolve the first photoresist layer 80.

Figure 6F:
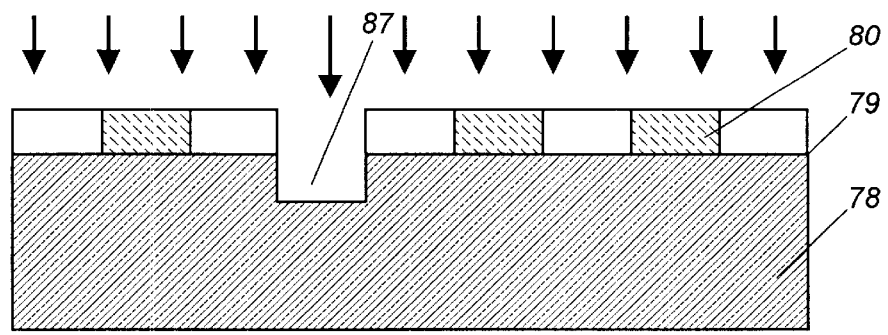

Referring to FIG. 6f, a groove 87 is formed in the substrate surface 79 using dry-etch techniques such as ion mill etching. The groove 87 provides a recess for the first type of reflective recessed finger structure 88 and is formed having a depth that is different from the depth of the second type of reflective recessed structure 94.

Figure 6G:
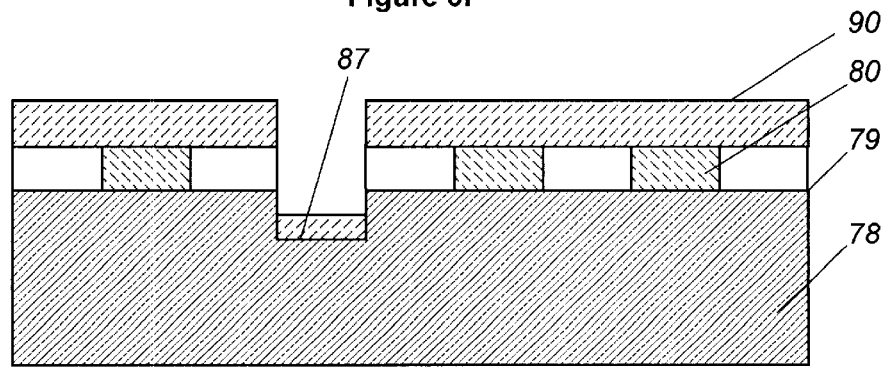

Next, as illustrated in FIG. 6g, the substrate surface 79 is coated with a third layer of photoresist 90. Again, the thickness of the photoresist layer 90 is chosen so that a sufficient amount will be left after grooves (87, 89) have been formed.

Figure 6H:
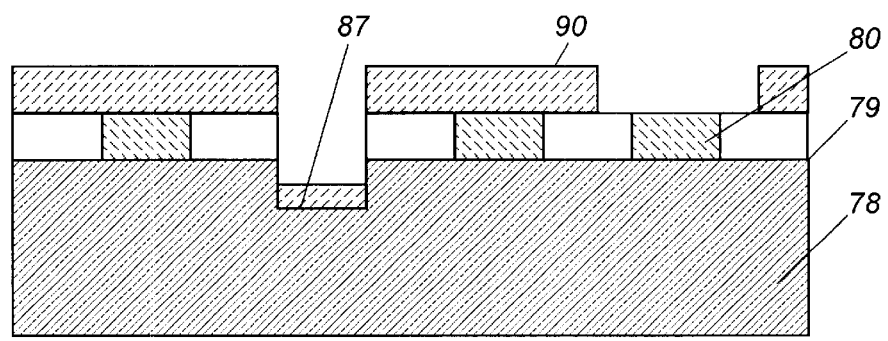

Referring to FIG. 6h, a third mask (not shown) is aligned to the substrate surface 79 and the third photoresist layer 90 is exposed to an ultra violet (UV) light source (not shown) operating at the optical wavelength $\lambda_2$. Next, the third photoresist layer 90 is developed using a developer that will not simultaneously develop the first photoresist layer 80, yet transfers a pattern of the reflective recessed finger pattern 94 to the third photoresist layer 90.

Figure 6I:
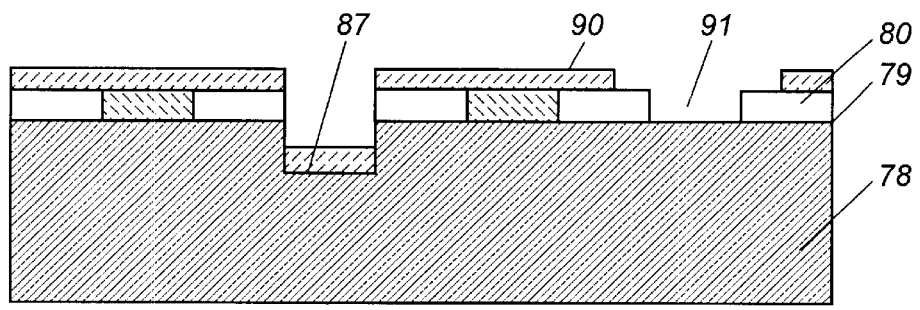
Figure 6J:
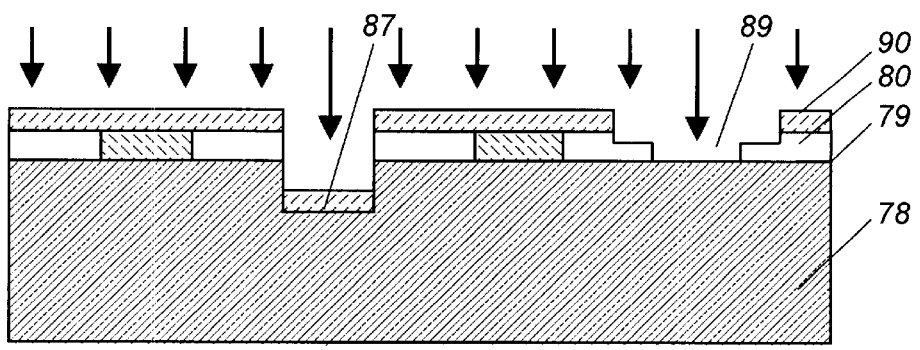

Referring to FIGS. 6i and 6j, respectively, the first photoresist layer 80 is partially developed at numeral 91 forming a photoresist mask pattern from the photoresist layer 80. As shown in FIG. 6j, the substrate surface 79 is dry-etched using an ion mill or similar etching technique to facilitate the formation of a second groove 89 in the substrate surface 79. The second groove 89 forms the recess of the second type of reflective recessed finger structure 94, and is formed at a depth that is different from the depth of the first type of reflective recessed finger structure 88.

Figure 6K:
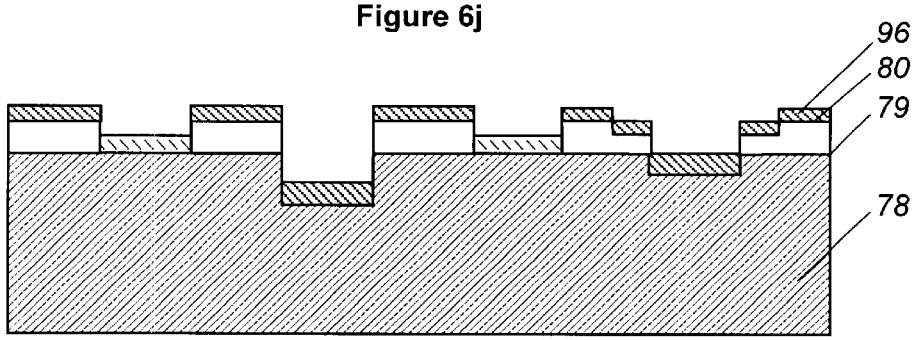

Referring to FIG. 6k, the third photoresist resist layer 90 is removed by using a solvent that will not simultaneously dissolve the first photoresist layer 80. The first photoresist layer 80 is then developed, exposing the areas where the electrodes 98 will be deposited. And a metal film 96, preferably an aluminum (Al) or similar metal material, is deposited over the substrate surface 79 to form the pattern of electrode fingers 98 shown in FIG. 6l.

Figure 6L:
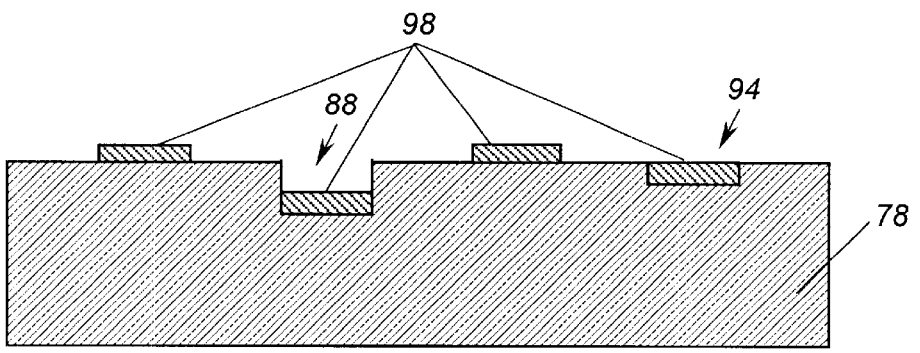

Finally, as shown in FIG. 6l, the first photoresist layer 80 is lifted-off the substrate surface 79 to expose the pattern of electrodes 98 and reflective recessed finger structures (88, 94) formed on the substrate surface 79.

Referring now to FIG. 7, an alternative method of fabricating an RFSPUDT type transducer in shown.

Figure 7A:
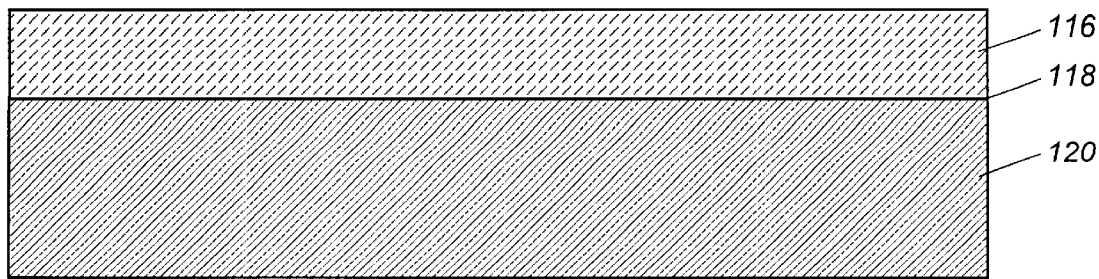
FIGS. 7a through 7p are side cross-sectional view illustrations of a fabrication method of an RFSPUDT of the present invention.
Figure 7B:
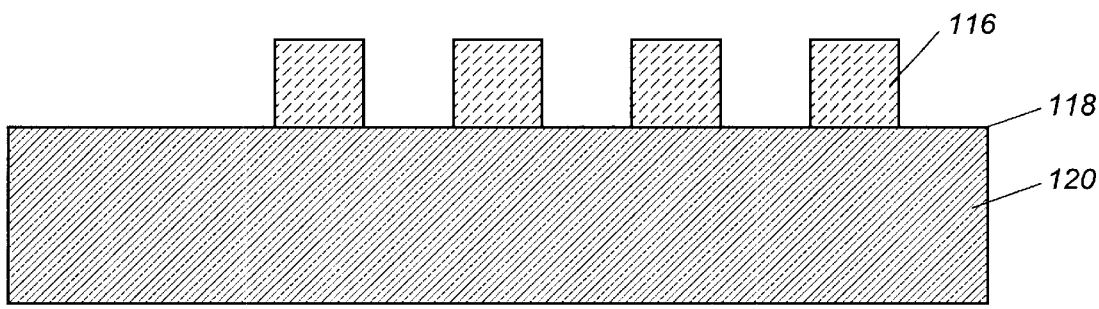

Referring to FIGS. 7a and 7b, respectively, a first layer of photoresist 116 is coated over a surface 118 of the substrate 120. Similar to previous methods, as shown in FIG. 7b, the first photoresist layer 116 is exposed to UV light through a first mask (not shown) and is further developed to transfer the pattern of the first mask to the first photoresist layer 116.

Figure 7C:
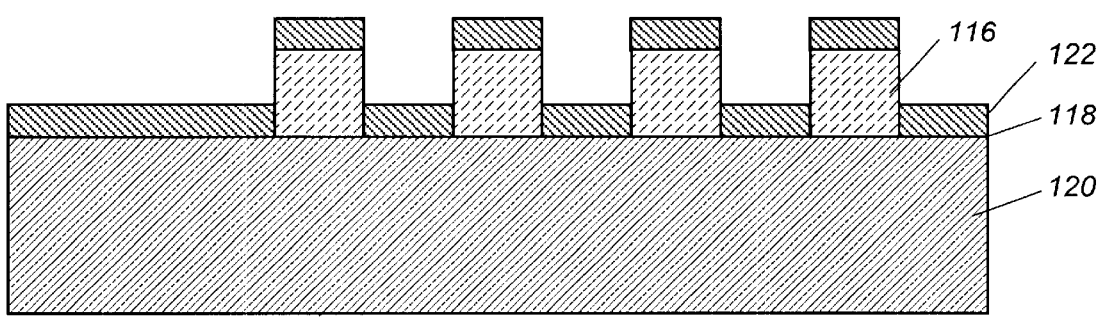
Figure 7D:
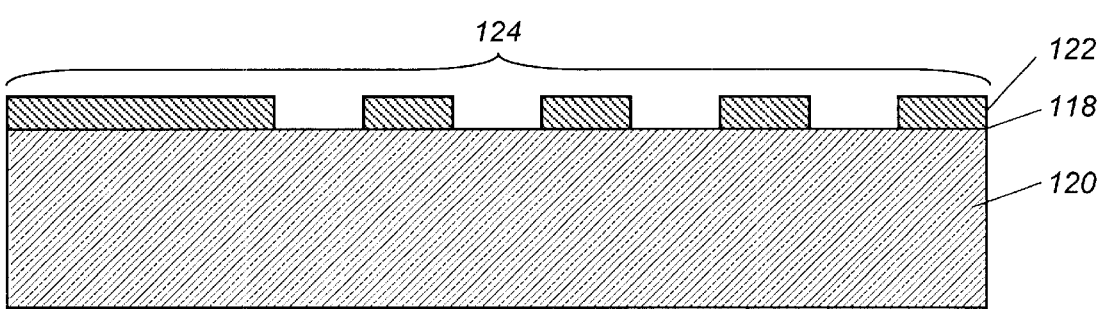

Referring to FIGS. 7c and 7d, respectively, a layer of masking material 122, such as titanium (Ti), is deposited over the substrate surface 118 using such techniques as e-beam evaporation. And, as illustrated in FIG. 7d, the first photoresist layer 116 is lifted-off the substrate surface 118 to form a key intermediate structure 124. This intermediate structure 124 will allow subsequent mask alignment tolerances to be as large as plus or minus one-half of the transducer's critical geometry without affecting the performance of the transducer due to electrode finger and reflective recessed finger structure misplacement.

Figure 7E:
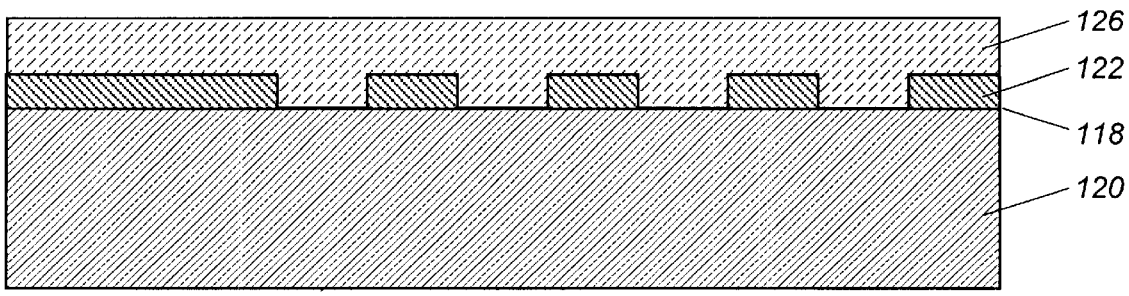
Figure 7F:
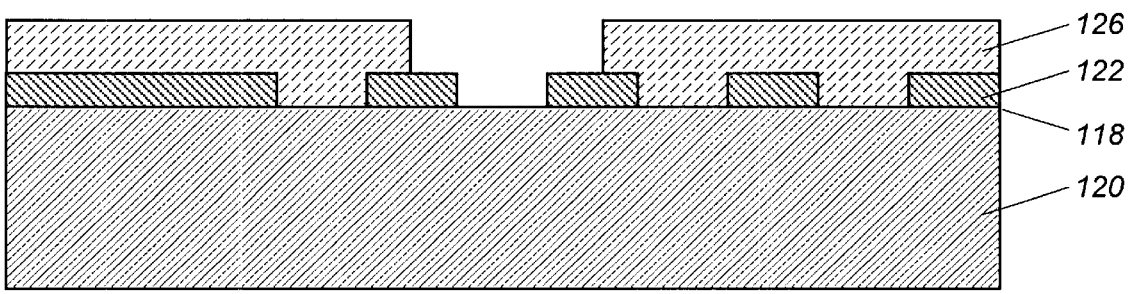

Referring to FIGS. 7e and 7f, respectively, a second layer of photoresist 126 is coated over the substrate surface 118. And, as shown in FIG. 7f, a second mask (not shown) is aligned to the substrate surface 118. The photoresist layer 126 is exposed to UV light through the second mask and developed to transfer a pattern of the second mask to the second photoresist layer 126. The second photoresist layer 126, following the exposure and development steps, itself forms a mask that is used to create a groove 130 (see FIG. 7g below) for the first type of reflective recessed finger structure 128, later shown in FIG. 7p.

Figure 7G:
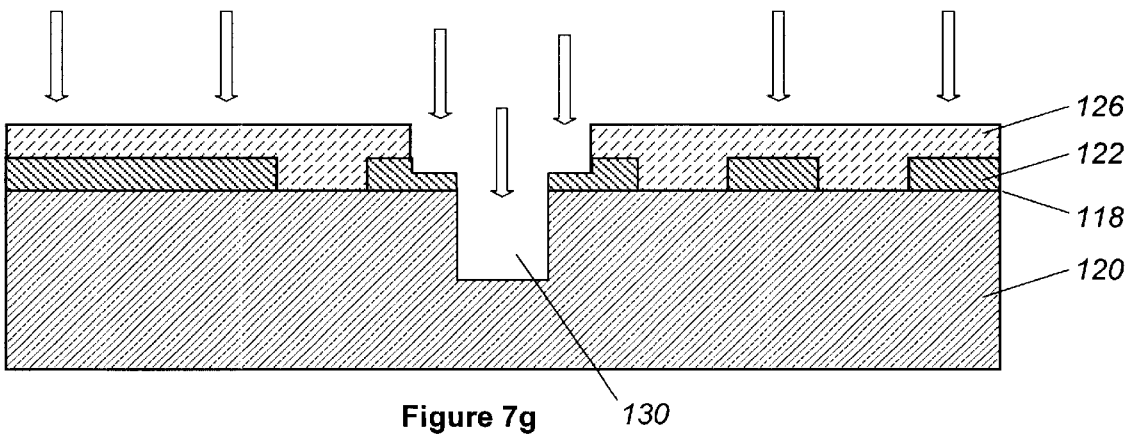
Figure 7H:
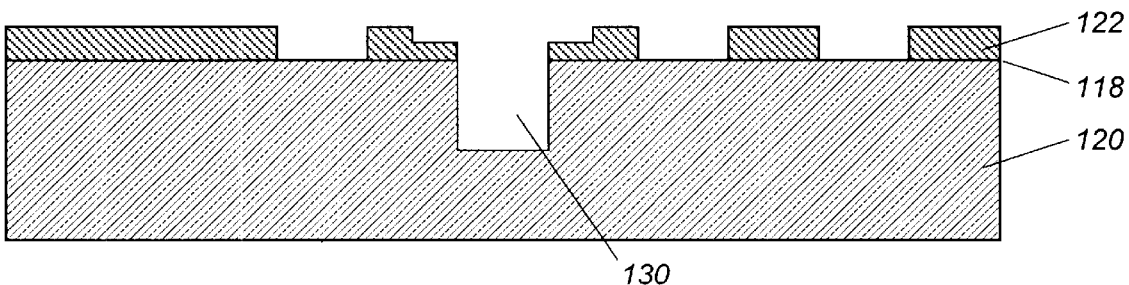

Next, referring to FIGS. 7g and 7h, respectively, the substrate surface 118 is etched, using ion-beam or a similar etching technique, to form the groove 130 of the first type of reflective recessed finger structure 128. The groove 130 is formed having some predetermined depth. Next, as shown in FIG. 7h, the second photoresist layer 126 removed from the substrate surface 118.

Figure 7I:
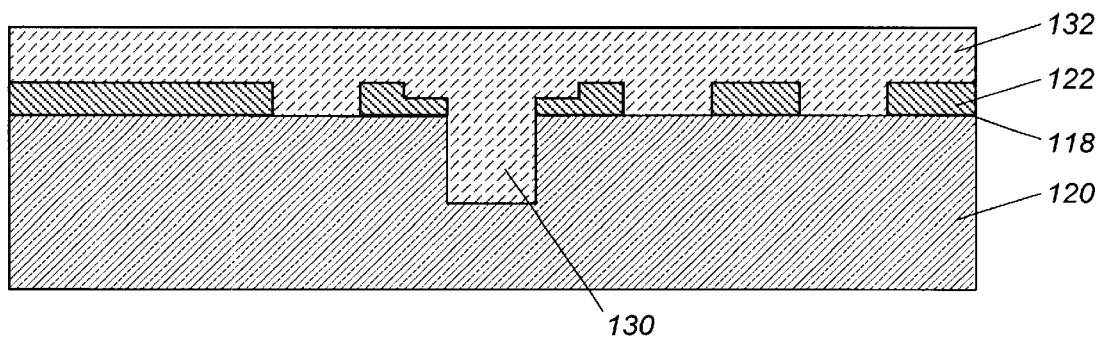
Figure 7J:
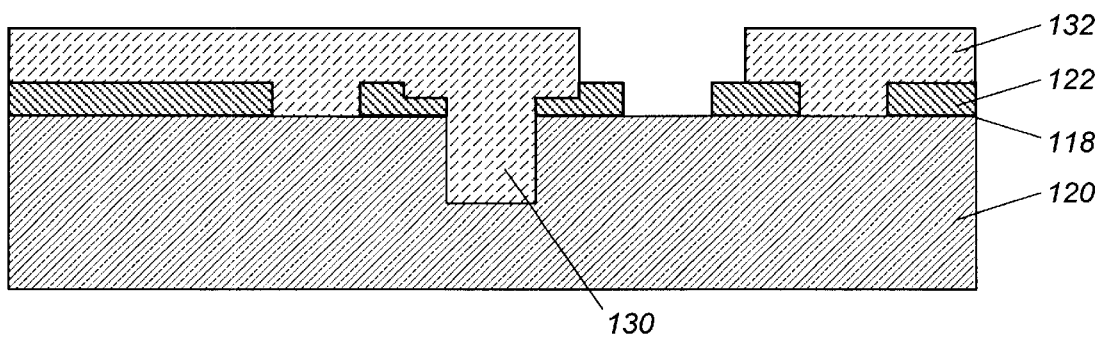

Referring now to FIGS. 7i and 7j, respectively, the substrate surface 118 is coated with a third layer of photoresist 132. As shown in FIG. 7j, a third mask (not shown) is aligned to the substrate surface 118. And the third photoresist layer 132 is exposed to UV light through the third mask and developed to transfer a pattern of the third mask to the third photoresist layer 132. The third photoresist layer 132, following the exposure and development steps, itself forms a mask that is used to create a groove 131 (see FIG. 7k below) for the second type of reflective recessed finger structure 129.

Figure 7K:
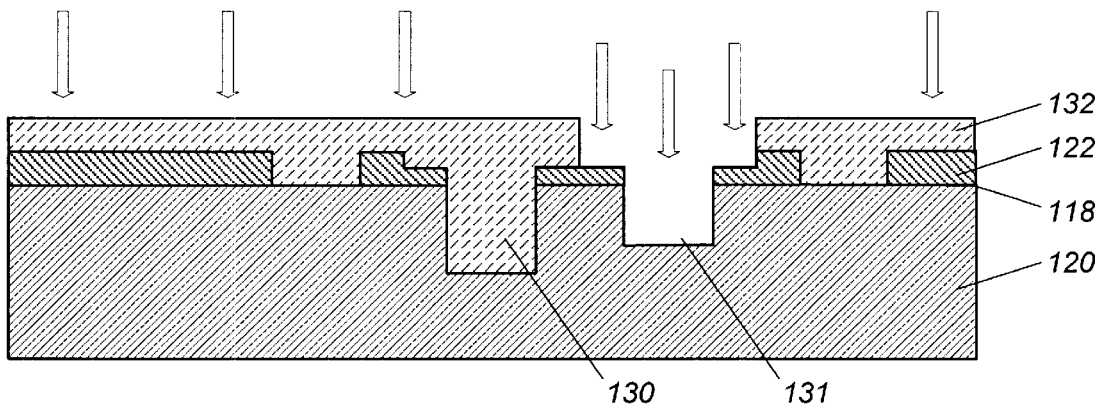
Figure 7L:
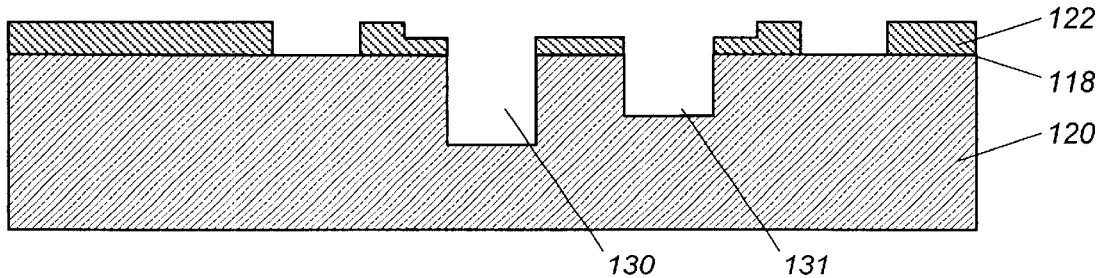

Next, referring to FIGS. 7k and 7l, respectively, the substrate surface 118 is etched using ion-beam etching or a similar etching technique to form the groove 131 at a depth that is different from the depth of the groove 130 previously described. And, as shown in FIG. 7l, the third photoresist layer 132 is removed from the substrate surface 118

Figure 7M:
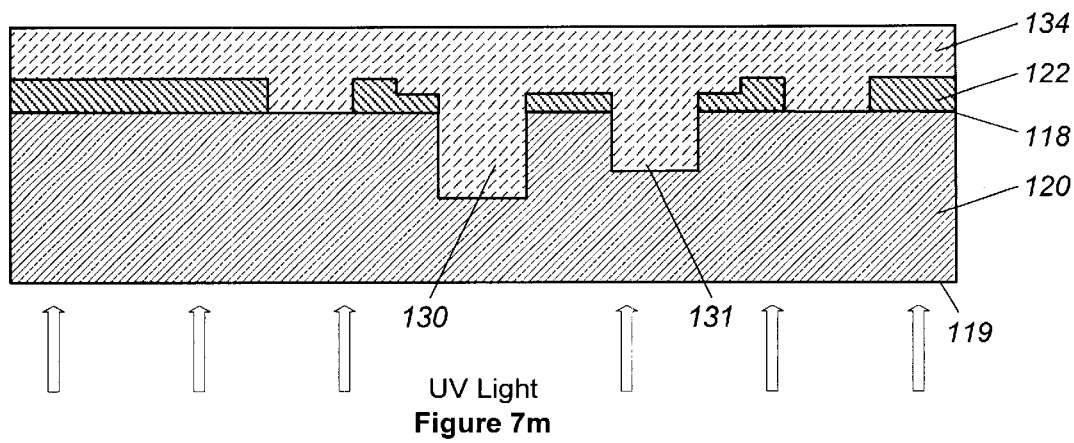
Figure 7N:
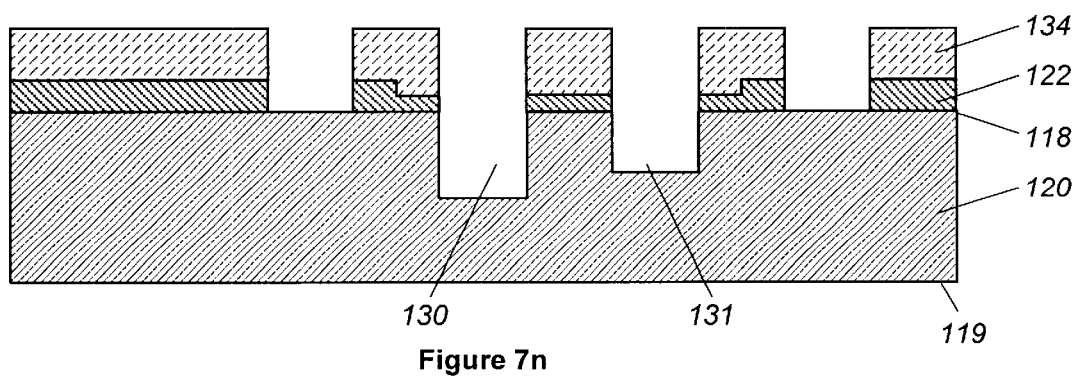

Referring to FIGS. 7m and 7n, respectively, a fourth layer of photoresist 134 is coated over the substrate surface 118. However, unlike previous exposure steps, the fourth layer of photoresist 134 is exposed to UV light from a back side 119 of the substrate and, during exposure, the intermediate structure previously formed in FIG. 7d serves as the mask. Next, as shown in FIG. 7n, the fourth photoresist layer 134 is developed so that the photoresist layer 134 itself forms a mask for subsequent processing steps.

Figure 7O:
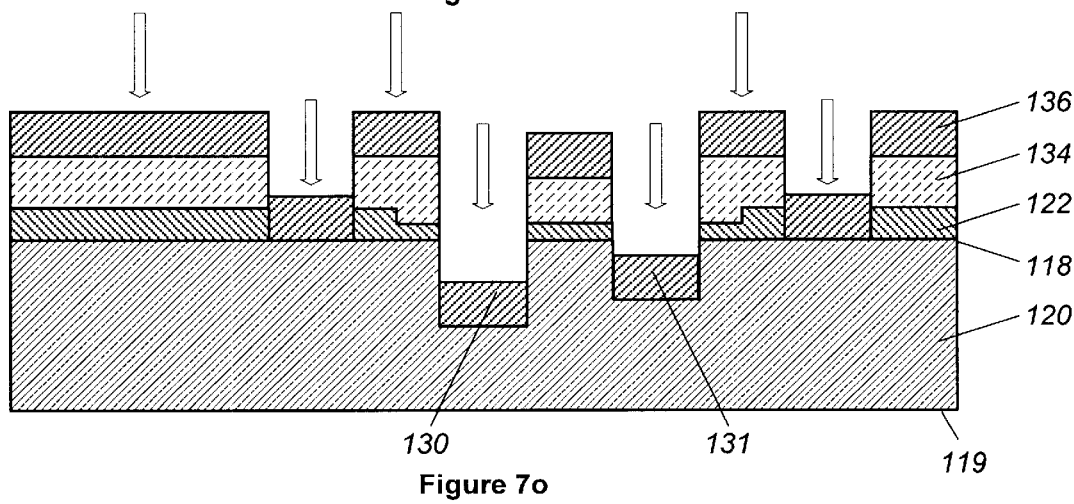

Referring now to FIG. 7o, a layer of metal film 136, such as aluminum, is deposited over the substrate surface 118 using such techniques as e-beam evaporation.

Figure 7P:
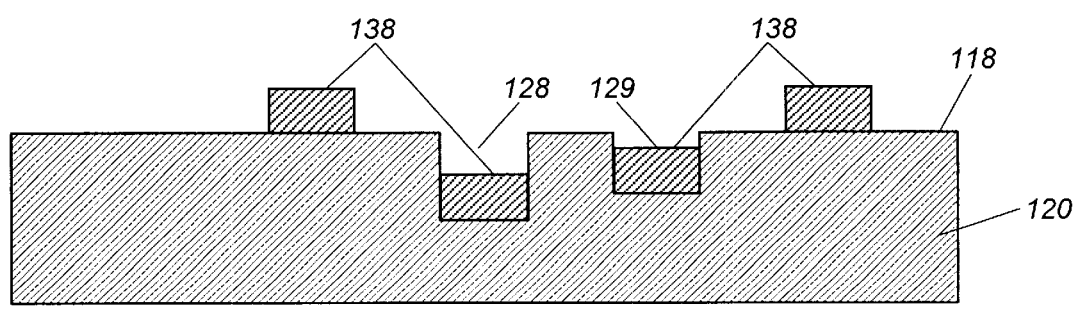

And finally, referring to FIG. 7p, following the removal of the fourth photoresist layer 134 and the masking layer 122 from the substrate surface 118 the final structure of the RFSPUDT is exposed. The masking layer 122 is preferably removed using a wet-chemical etching technique to obtain the desired transducer structure.

In accordance with the advantages of the present invention, achieving unidirectionality in a RESPUDT structure that includes uniform width, single-level electrode fingers lying on a uniform grid and selectively etched reflective recessed gap or finger structures within the transducer can provide a transducer structure that facilitates the implementation of high performance RESPUDT SAW filters. By using such reflective structures, acoustic energy within the transducer that would otherwise be useless, is reflected so that the insertion loss is reduced and the triple transit is cancelled by the reflected energy, thereby providing significant improvements in pass band response. Moreover, by applying this recessed reflector concept to lower sampling rate bi-directional structures, like those described herein, SPUDT filters can be produced that operate at high frequencies. And, as communication and like system technologies advance, the need for higher operating frequency and improved performance SPUDT filters can be satisfied based on the teachings of the present invention.

Obviously, many modifications and variations of the present invention are possible in light of the above teachings. Thus, it is to be understood that, within the scope of the appended claims, the invention may be practiced otherwise than as specifically described above.

What is claimed is:

1. A surface acoustic wave transducer having a transduction length measured in wavelengths, comprising:

a piezoelectric substrate;

a pattern of electrodes formed on a surface of the substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

a first reflective structure formed in a first gap located between two adjacent electrodes within a first $N\lambda$ of the transduction length for creating a first finite localized surface acoustic wave reflection function in both magnitude and phase; and a second reflective structure formed in a second gap located between two adjacent electrodes within a second $N\lambda$ of the transduction length for creating a second finite localized surface acoustic wave reflection other than zero in both magnitude and phase, the combined first and second finite localized reflection functions of all transduction lengths forming a desired continuous reflection function within the transducer;

and wherein the first reflective structure comprises the substrate surface at the first gap having a plurality of randomly distributed recesses formed therein, each of the randomly distributed recesses having a predetermined depth equal to the depth of each other randomly distributed recess.

2. A surface acoustic wave transducer having a transduction length measured in wavelengths, comprising:

a piezoelectric substrate;

a pattern of electrodes formed on a surface of the substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

a first reflective structure formed in a first gap located between two adjacent electrodes within a first $N\lambda$ of the transduction length for creating a first finite localized surface acoustic wave reflection function in both magnitude and phase; and a second reflective structure formed in a second gap located between two adjacent electrodes within a second $N\lambda$ of the transduction length for creating a second finite localized surface acoustic wave reflection other than zero in both magnitude and phase, the combined first and second finite localized reflection functions of all transduction lengths forming a desired continuous reflection function within the transducer;

and wherein the second reflective structure comprises the substrate surface at the second gap having a plurality of randomly distributed recesses formed therein, each of the randomly distributed recesses having a predetermined depth equal to the depth of each other randomly distributed recess.

3. A surface acoustic wave transducer having a transduction length measured in wavelengths, comprising:

a piezoelectric substrate, the piezoelectric substrate having a first and a second groove etched into a surface thereof;

a pattern of electrodes formed on the surface of the substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

a first reflective structure formed within a first $N\lambda$ of the transduction length, the first reflective structure formed of the first groove, the first groove having one electrode in the pattern of electrodes disposed therein for creating a first finite localized surface acoustic wave reflection function other than zero in both magnitude and phase; and a second reflective structure formed within a second $N\lambda$ of the transduction length, the second reflective structure formed of the second groove, the second groove having one other electrode in the pattern of electrodes disposed therein for creating a second finite localized surface acoustic wave reflection function other than zero in both magnitude and phase, the combined first and second finite localized reflection functions of all transduction lengths forming a desired continuous reflection function within the transducer;

wherein the first and the second groove within an entire transduction length each have a predetermined depth;

and wherein the predetermined depth of the first groove is different from the predetermined depth of the second groove.

4. A surface acoustic wave transducer having a transduction length measured in wavelengths, comprising:

a piezoelectric substrate, the piezoelectric substrate having a first and a second groove etched into a surface thereof;

a pattern of electrodes formed on the surface of the substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

a first reflective structure formed within a first $N\lambda$ of the transduction length, the first reflective structure formed of the first groove, the first groove having one electrode in the pattern of electrodes disposed therein for creating a first finite localized surface acoustic wave reflection function other than zero in both magnitude and phase; and a second reflective structure formed within a second $N\lambda$ of the transduction length, the second reflective structure formed of the second groove, the second groove having one other electrode in the pattern of electrodes disposed therein for creating a second finite localized surface acoustic wave reflection function other than zero in both magnitude and phase, the combined first and second finite localized reflection functions of all transduction lengths forming a desired continuous reflection function within the transducer;

and wherein the first groove is formed of a plurality of randomly distributed recesses.

5. A surface acoustic wave transducer having a transduction length measured in wavelengths, comprising:

a piezoelectric substrate, the piezoelectric substrate having a first and a second groove etched into a surface thereof;

a pattern of electrodes formed on the surface of the substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

a first reflective structure formed within a first $N\lambda$ of the transduction length, the first reflective structure formed of the first groove, the first groove having one electrode in the pattern of electrodes disposed therein for creating a first finite localized surface acoustic wave reflection function other than zero in both magnitude and phase; and a second reflective structure formed within a second $N\lambda$ of the transduction length, the second reflective structure formed of the second groove, the second groove having one other electrode in the pattern of electrodes disposed therein for creating a second finite localized surface acoustic wave reflection function other than zero in both magnitude and phase, the combined first and second finite localized reflection functions of all transduction lengths forming a desired continuous reflection function within the transducer;

and wherein the second groove is formed of a plurality of randomly distributed recesses.

6. A surface acoustic wave filter comprising:

a first surface acoustic wave transducer and a second surface acoustic wave transducer spaced from the first surface acoustic wave transducer, each having a transduction length measured in wavelengths, each of the first and second surface acoustic wave transducers including a pattern of electrodes formed on a surface of a piezoelectric substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

the first transducer being constructed of a first reflective structure formed in a first gap located between two adjacent electrodes within a first $N\lambda$ of the transduction length for creating a first finite localized surface acoustic wave reflection function other than zero in both magnitude and phase and, a second reflective structure formed in a second gap located between two adjacent electrodes within a second $N\lambda$ of the transduction length for creating a second finite localized surface acoustic wave reflection function other than zero in both magnitude and phase, the combined first and second finite localized reflection functions of all transduction lengths of the first transducer forming a desired continuous reflection function within the first transducer, the desired continuous reflection function within the first transducer providing unidirectional transmission substantially in the direction of the second surface acoustic wave transducer; and the second transducer being constructed of a first reflective structure formed in a first gap located between two adjacent electrodes within a first $N\lambda$ of the second transducer transduction length for creating a first finite localized surface acoustic wave reflection function other than zero in both magnitude and phase and, a second reflective structure formed in a second gap located between two adjacent electrodes within a second $N\lambda$ of the second transducer transduction length for creating a second finite localized surface acoustic wave reflection function other than zero in both magnitude and phase; and the combined first and second finite localized reflection functions of all transduction lengths of the second transducer forming a desired continuous reflection function within the second transducer desired transduction center, the desired continuous reflection function within the second transducer providing unidirectional transmission substantially in the direction of the first surface acoustic wave transducer;

and wherein a transduction center of each of the first and second surface acoustic wave transducers is spatially shifted in phase by substantially plus or minus 45 degrees.

7. A surface acoustic wave filter comprising:

a first surface acoustic wave transducer and a second surface acoustic wave transducer spaced from the first surface acoustic wave transducer, each having a transduction length measured in wavelengths, each of the first and second surface acoustic wave transducers including a pattern of electrodes formed on a surface of a piezoelectric substrate in the transduction length, the pattern of electrodes being formed of M uniform-width, uniformly spaced, single-level interdigitated electrodes per each $N\lambda$ of the transduction length, adjacent electrodes having a center to center spacing of $N\lambda/M$;

the first transducer being formed of a first reflective structure contained within a first $N\lambda$ of the transduction length and a second reflective structure contained within a second $N\lambda$ of the transduction length, the first reflective structure formed of the substrate surface having a first groove etched therein, the first groove having one electrode in the pattern of electrodes disposed therein for creating a first finite localized surface acoustic wave reflection function other than zero in both magnitude and phase, the second reflective structure formed of the substrate surface having a second groove etched therein, the second groove having one other electrode in the pattern of electrodes disposed therein for creating a second finite localized surface acoustic wave reflection function other than zero in both magnitude and phase, the combined first and second finite localized reflection functions of all transduction lengths forming a desired continuous reflection function within the first transducer, the desired continuous reflection function within the first transducer providing unidirectional transmission substantially in the direction of the second surface acoustic wave transducer; and the second transducer being formed of a first reflective structure contained within a first $N\lambda$ of the second transducer transduction length and a second reflective structure contained within a second $N\lambda$ of the second transducer transduction length, the first reflective structure formed of the substrate surface having a first groove etched therein, the first groove having one electrode in the pattern of electrodes disposed therein for creating a first finite localized surface acoustic wave reflection function other than zero in both magnitude and phase, the second reflective structure formed of the substrate surface having a second groove etched therein, the second groove having one other electrode in the pattern of electrodes disposed therein for creating a second finite localized surface acoustic wave reflection function other than zero in both magnitude and phase, the combined first and second finite localized reflection functions of all transduction lengths forming a desired continuous reflection function within the second transducer, the desired continuous reflection function within the second transducer providing unidirectional transmission substantially in the direction of the first surface acoustic wave transducer;

and wherein a transduction center of each of the first and second surface acoustic wave transducers is spatially shifted in phase by substantially plus or minus 45 degrees.

\* \* \* \* \*